United States Patent [19]
Isono et al.

[11] Patent Number: 6,093,509
[45] Date of Patent: *Jul. 25, 2000

[54] LITHOGRAPHIC PRINTING PLATE

[75] Inventors: Masanao Isono, Aichi-ken; Yuzuru Baba, Shiga-ken; Norikazu Tabata, Shiga-ken; Norimasa Ikeda, Shiga-ken, all of Japan

[73] Assignee: Toray Industries, Inc., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/722,233
[22] PCT Filed: Feb. 14, 1996
[86] PCT No.: PCT/JP96/00324
  § 371 Date: Dec. 10, 1996
  § 102(e) Date: Dec. 10, 1996
[87] PCT Pub. No.: WO96/25295
  PCT Pub. Date: Aug. 22, 1996

[30] Foreign Application Priority Data

| Feb. 14, 1995 | [JP] | Japan | 7-025386 |
| Feb. 14, 1995 | [JP] | Japan | 7-025387 |
| Feb. 22, 1995 | [JP] | Japan | 7-033541 |

[51] Int. Cl.$^7$ ................................................ G03F 7/004
[52] U.S. Cl. ................ 430/18; 430/271.1; 430/302; 101/457; 101/461; 101/462; 101/465
[58] Field of Search ................... 430/18, 271.1, 430/302; 101/457, 461, 462, 465

[56] References Cited

U.S. PATENT DOCUMENTS

| 2,800,077 | 7/1957 | Marron | 101/461 |
| 3,476,937 | 11/1969 | Vrancken | 250/65 |
| 3,793,025 | 2/1974 | Vraneken et al. | 430/294 |
| 5,571,658 | 11/1996 | Sonokawa et al. | 430/273.1 |

FOREIGN PATENT DOCUMENTS

| 0 243 863 | 11/1987 | European Pat. Off. . |
| 0 398 325 | 11/1990 | European Pat. Off. . |
| 59-135191 | 8/1984 | Japan . |
| 59-154443 | 9/1984 | Japan . |
| 6-324496 | 11/1994 | Japan . |
| 50-19460 | 8/1995 | Japan . |

OTHER PUBLICATIONS

Patent Abstracts of Japan, vol. 096, No. 003, Mar. 29, 1996, and JP 07 301920 A (Toyobo Co., Ltd.) Nov. 14, 1995, abstract only.

Patent Abstracts of Japan, vol. 018, No. 581, (P–1822), Nov. 7, 1994 and JP 06 214389 A, (Asahi Chem. Ind. Co. Ltd.), Aug. 5, 1994, abstract only.

Patent Abstracts of Japan, vol. 007, No. 250, (M–254), Nov. 8, 1983 and JP 58 134795 A, (Ricoh KK), Aug. 11, 1983, abstract only.

*Primary Examiner*—Bernard Codd
*Attorney, Agent, or Firm*—Morrison & Foerster LLP

[57] ABSTRACT

A lithographic printing plate, in which (1) the non-image area of a hydrophilic swellable layer is 1 to 50 g/m$^2$ in water absorbability, and the water absorbability of the image area is less than that of the non-image area, (2) the non-image area of a hydrophilic swellable layer is 0.01 to 10 kg/mm$^2$ in initial modulus, and the initial modulus of the image area is larger than that of the non-image area, (3) the non-image area of a hydrophilic swellable layer is 10 to 2000% in water swelling ratio, and the water swelling ratio of the image area is less than that of the non-image area, or (4) the hydrophilic swelling layer has a phase separated structure consisting of at least two phases; a phase mainly composed of a hydrophilic polymer and a phase mainly composed of a hydrophobic polymer, can be produced from a new photosensitive lithographic original plate simple in development treatment, highly repellent against ink even without being etched, and allowing the use of pure water as dampening water.

25 Claims, 3 Drawing Sheets

10 μm

10 μm

10 μm

150 μm

LITHOGRAPHIC PRINTING PLATE

TECHNICAL FIELD

The present invention relates to a Lithographic printing plate, particularly a lithographic printing plate which can be produced from a new photosensitive lithographic original plate simple in development treatment, highly repellent against ink even without being etched, and allowing the use of pure water as dampening water.

BACKGROUND ART

In lithographic printing, an image area capable of receiving ink and a non-image area capable of repelling ink respectively exist basically almost on the same level on a printing plate, and the difference between both the areas in ink acceptability is used so that the image area only may have ink deposited and subsequently transferred onto a material to be printed, such as paper. The lithographic printing plate usually uses a pre-sensitized plate.

The term "pre-sensitized plate" in this specification means the following.

As described in Teruhiko Yonezawa, "Introduction to Pre-Sensitized Plates (in Japanese)", K.K. Insatsu Gakkai Shuppanbu, Pages 18 through 81, an aluminum substrate treated to be hydrophilic is coated with a lipophilic photosensitive resin layer, and a photo lithographic technique is used to cause the photosensitive layer to leave on the image area and to expose the aluminum substrate surface on the non-image area, for having a dampening water layer formed on the surface to repel ink, for image formation. This plate is called a water-using pre-sensitized plate. There is also a waterless pre-sensitized plate, in which a silicone rubber layer is used as an ink repelling layer instead of the dampening water layer.

The waterless plate means a printing plate, the non-image area of which is made of a material capable of repelling the oil ink usually used for lithographic printing, such as silicone rubber or fluorine-containing compound, for image formation in combination with the image area capable of having ink deposited, to allow printing without using dampening water.

The former water-using pre-sensitized plate is in practice an excellent printing plate, and usually aluminum is used for the substrate. The surface of the aluminum substrate must be able to hold water, and be excellent in adhesiveness to the lipophilic photosensitive resin layer lest the photosensitive layer should peel and come off during printing from the surface. So, the aluminum surface is usually grained, and furthermore, as required, the grained surface is treated by anodized oxidation, etc., to improve the water-holding capacity and the adhesiveness to the photosensitive resin layer. Moreover, to secure the storage stability of the photosensitive resin layer, the aluminum surface is generally chemically treated by zirconium fluoride or sodium silicate, etc.

As can be seen from the above, the process for producing a water-using pre-sensitized plate is complicated and should be simplified, and yet water-using pre-sensitized plates are widely used since they are excellent in printing capabilities such as printing durability and image reproducibility.

To solve the above problem, new lithographic materials equivalent or superior to the aluminum substrate in printing capabilities, but lower in material cost and simpler to produce are proposed as substitutes for the aluminum substrate. For example, Japanese Patent Publication (Kokoku) No. 56-2938 proposes to use a substrate coated with an ink repelling layer composed of a hydrophilic high polymer, instead of the aluminum substrate, and to form a photosensitive layer on the substrate. However, since a water resistant layer composed of an aldehyde condensation product of polyvinyl chloride, polyurethane or polyvinyl alcohol is simply covered with a hydrophilic layer composed of urea resin, the hydrophilic layer is insufficient in ink repellency, and in addition, poor in adhesion to the photosensitive resin layer, resulting in its being insufficient in printing durability. Furthermore, Japanese Patent Laid-Open (Kokai) No. 57-179852 proposes to coat a substrate with a hydrophilic radical-polymerized compound, and to irradiate the surface of the substrate with an active beam for making it hydrophilic, and then to cover it with a photosensitive resin layer. However, the hydrophilic surface layer formed by this method is rigid and insufficient in ink repellency, and also poor in printing durability.

Moreover, since the development of these water-using pre-sensitized plates dissolves the photosensitive layer for exposing the surface of the aluminum substrate, the photosensitive layer is inevitably dissolved into the developer, and the developer is significantly changed in chemical composition, to thus becoming "fatigued" in a short time. So waste developer is generated in a large quantity.

Thus, the developer must be exchanged frequently for maintenance. Furthermore, the waste developer generated must be treated with enormous efforts and cost.

On the other hand, as a simple version of water-using pre-sensitized plates, directly image-forming lithographic original plates are widely practically used. In these plates, an image is formed in an image receiving layer composed of a toner, etc. formed on a substrate such as paper, using a plain paper copier, and the non-image area is desensitized by an etchant, etc., to convert the image receiving layer into an ink repellent layer. Concretely, generally an image receiving layer composed of a water soluble binder polymer, inorganic pigment, water resisting reagent, etc. is formed on a water resistant substrate. Techniques of this category are proposed in U.S. Pat. No. 2,532,865, Japanese Patent Publication (Kokoku) No. 40-23581, Japanese Patent Laid-Open (Kokai) Nos. 48-9802, 57-205196, 60-2309, 57-1791, 57-15998, 57-96900, 57-205196, 63-166590, 63-166591, 63-317388, 1-114488, 4-367868, etc. For these direct image-forming lithographic original plates, the image receiving layer proposed to be converted into an ink repelling layer is composed of a water soluble polymer hydrophilic already before etching, such as PVA, starch, hydroxyethyl cellulose, casein, gelatin, polyvinyl pyrrolidone, vinyl acetate-crotonic acid copolymer, or styrene-maleic acid copolymer, or a water dispersible polymer such as an acrylic resin emulsion, and an inorganic pigment such as silica or calcium carbonate, and also a water resisting reagent such as melamine formaldehyde resin condensation product. Japanese Patent Laid-Open No. 63-256493, etc. propose a direct image-forming lithographic original plate which uses a hydrophobic polymer to be hydrolyzed by etching for generating hydrophilic groups, as a main component.

These direct image-forming lithographic original plates inevitably require etching for converting the image receiving layer into an ink repelling layer, and without etching, they little show ink repellency.

To obtain practical ink repellency, etching and the use of a hydrophilic binder polymer in a large quantity are required, but these tend to degrade water resistance, lowering printing durability. Furthermore, enhancing the hydrophilicity involves a problem that the adhesiveness to the image formed by a toner, etc. tends to decline. On the other hand, if the amount of the water resisting reagent added is increased or a hydrophobic polymer is added, respectively to enhance water resistance for improving printing durability, there arises a problem that the hydrophilicity is lowered to considerably lower the ink repellency.

Printing plate techniques-based on one processing step of exposure only without requiring development, lacquering and etching at all, by applying the hydrophilicity/hydrophobicity conversion reaction developed by Union Carbide are disclosed in Japanese Patent Publication (Kokoku) Nos. 42-131, 42-5365, 42-14328, and 42-20127, U.S. Pat. Nos. 3,231,377, 3,231,381, 3,231,382, etc. The plates are coated with an association product of polyethylene oxide and phenol resin, together with a photosensitive material. However, these plates are not practical enough, since they are rigid and poorly flexible in the non-image area and insufficient in ink repellency, and since the difference between the ink repellency of the non-image area and the ink anchoring capability of the image area is too small.

Furthermore, in the case of water-using pre-sensitized plates, the quantity of dampening water must be constantly controlled, and properly controlling the quantity of dampening water requires substantial techniques and experience. Moreover, the isopropanol added to dampening water as an essential ingredient tends to be severely regulated in recent years in view of occupational health environment and waste water treatment, and this must be urgently responded to.

On the other hand, waterless pre-sensitized plates using a silicone rubber layer as the ink repellent layer instead of dampening water are being rapidly widely adopted in recent years and are highly practical, since the dampening water control work required for the water using pre-sensitized plates is not required at all to allow very simple printing work, as disclosed in Japanese Patent Publication (Kokoku) 54-26923, 57-3060, 56-12862, 56-23150, 56-30856, 60-60051, 61-54220, 61-54222, 61-54223, 61-616, 63-23544, 2-25498, 3-56622, 4-28098, and 5-1934, and Japanese Patent Laid-Open (Kokai) Nos. 2-63050 and 2-63051, etc. However, since a silicone rubber layer weak in mechanical strength is used as the ink repellent layer, its durability is insufficient, and an ink repellent material excellent in durability is highly demanded.

Furthermore, in the development, the silicone rubber layer must be mechanically removed by brushing, and the waste developer containing the removed silicone rubber particles is generated in a large quantity. In addition, the life of the brush is short, to require the frequent exchange of brush, and a maintenance action must be taken to collect and dump the silicone rubber particles.

DISCLOSURE OF THE INVENTION

The inventors studied intensively to develop an ideal lithographic material which allows wider range of quantity control of dampening water in the conventional lithographic printing using a water-using pre-sensitized plate, allows the use of dampening water free from isopropanol so far considered to be impossible, allows the image formation like a plain paper copier as adopted in direct image-forming lithographic original plates without any complicated plate making step such as etching, can overcome the insufficient durability fatal to the waterless plate using a silicone rubber layer as the ink repellent layer, does not require the maintenance of development essentially required in the conventional pre-sensitized plates, and is simple in production. As a result, they found that such a lithographic printing material can be realized as a lithographic printing plate in which a hydrophilic swellable layer with a phase-separated structure composed of specific materials is used as the ink repellent layer.

DETAILED DESCRIPTION OF THE INVENTION

Figure 1:
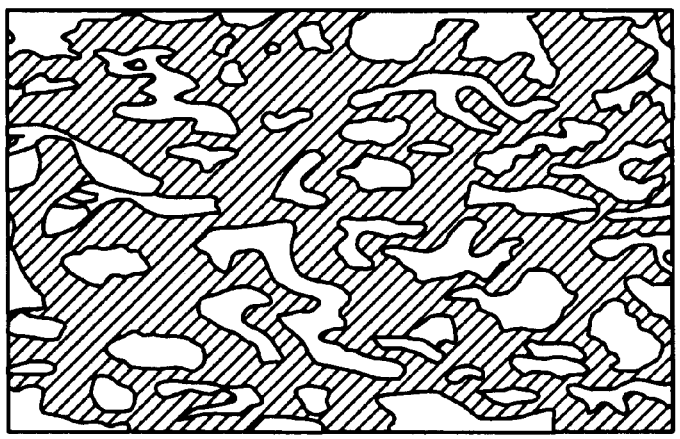
FIG. 1 is a typical view showing an example of the phase-separated structure of the hydrophilic swellable layer in the lithographic printing plate of the present invention.

The non-image area of the lithographic printing plate of the present invention is characteristically formed in a hydrophilic swellable layer.

The hydrophilicity in the present invention means a nature of being substantially insoluble in water and capable of being swollen by water. The hydrophilic swellable layer can be obtained by laminating a known hydrophilic polymer on a substrate by coating or transfer, etc., crosslinking or pseudo-crosslinking it by a conventional method, to make it insoluble in water and swellable by water. The hydrophilic swellable layer preferably has a phase-separated structure consisting of at least two phases; a phase mainly composed of a hydrophilic polymer and a phase mainly composed of a hydrophobic polymer.

The hydrophilic polymer used in the hydrophilic swellable layer of the present invention is described below.

A hydrophilic polymer means any known water soluble polymer (which means a polymer perfectly soluble in water), or any water pseudo-soluble polymer (which means an amphipathic polymer soluble in water macroscopically but containing non-dissolved portions microscopically), or any water swellable polymer (which means a polymer capable of being swollen by water but insoluble in water). In other words, it means a polymer capable of adsorbing or absorbing water under ordinary service conditions, and a polymer capable of being dissolved in water or swollen by water.

In the present invention, the hydrophilic polymer can be selected from known polymers such as animal based polymers, plant based polymers, and synthetic polymers. For example, such hydrophilic polymers are stated in "Functional Monomers" (Y. Nyquist, Dekker), "Water Soluble High Polymers (in Japanese)" (Nakamura, Kagaku Kogyosha), "Water Soluble High Polymers; General Technical Data for the Latest Processing and Modifying Techniques of Water Dispersible Resins, and for the Development of Their Applications (in Japanese)" (Keiei Kaihatsu Center Shuppan-bu), "Applications and Market of Water Soluble Polymers, New Edition (in Japanese)" (CMC), etc. Examples are enumerated below.

(A) Natural High Polymers

Starch-acrylonitrile graft polymer hydrolysate, starch-acrylic acid graft polymer, starch-styrenesulfonic acid graft polylmer, starch-vinylsulfonic acid graft polymer, starch-acrylamide graft polymer, carboxylated methyl cellulose, methyl cellulose, hydropropylmethyl cellulose, hydroxyethyl cellulose, cellulose xanthogenate, cellulose-acrylonitrile graft polymer, cellulose-styrenesulfonic acid graft polymer, crosslinked carboxymethyl cellulose, hyaluronic acid, agarose, collagen, milk casein, acid casein, rennet casein, ammonia casein, potassium casein, borax casein, glue, gelatin, gluten, soybean protein, alginate, ammonium alginate, potassium alginate, sodium alginate, gum arabic, tragacanth gum, karaya gum, guar gum, locust bean gum, Irish moss, soybean lecithin, pectic acid, starch, carboxylated starch, agar, dextrin, mannan, etc.

(B) Synthetic High Polymers

Polyvinyl alcohol, polyethylene oxide, poly(ethylene oxide-co-propylene oxide), water urethane resins, water soluble polyesters, polyammonium acrylate, polysodium acrylate, N-vinylcarboxylic acid amide polymer, polyammonium methacrylate, acrylic copolymers, acrylic emulsion copolymers, crosslinked polyvinyl alcohol, crosslinked polysodium acrylate, saponified polyacrylonitrile, hydroxyethyl acrylate polymer, hydroxyethyl methacrylate polymer, poly(vinylmethyl ether-co-maleic anhydride), maleic anhydride copolymers, vinylpyrrolidone copolymers, crosslinked polyethylene glycol diacrylate, crosslinked polyethylene glycol dimethacrylate, crosslinked polypropylene glycol diacrylate, crosslinked polypropylene glycol dimethacrylate, etc.

The above hydrophilic compounds can contain a monomer different in substituent group, or comonomer for ensuring flexibility or controlling the hydrophilicity.

The hydrophilic polymers are described below in detail.

(1) Natural Proteins

The protein which can be used in the hydrophilic swellable layer of the present invention can be at least one selected from casein, gelatin, soybean protein, albumin, etc.

Casein is a main component of cow's milk proteins, and is not a single protein, but a mixture consisting of at least three similar proteins. Marketed casein products include lactic casein, sulfuric casein, hydrochloric casein, rennet casein, etc. respectively produced by different industrial methods, and are different in quality and chemical composition, depending on the production method. The casein used in the present invention can be any casein as far as it is a natural high polymer with many kinds of amino acids condensed.

As the gelatin, any conventional gelatin for photography which can be obtained mainly from cowls bones and skin by acid treatment or lime treatment. There are many kinds of amino acids constituting the gelatin, and various gelatins different in chemical composition can be obtained by selecting refining conditions. Gelatins different in quality and chemical composition can also be obtained by selecting the raw materials used. The gelatin used in the present invention can be any gelatin as far as it is a natural high polymer with many kinds of amino acids condensed.

Furthermore, natural proteins similar to casein in chemical properties such as soybean protein (soybean casein) and albumin can also be used in the present invention.

They include, for example, milk casein, acid casein, rennet casein, ammonia casein, potassium casein, borax casein, glue, gelatin, gluten, soybean lecithin, soybean protein, collagen, etc.

(2) Alginates

Ammonium alginate, potassium alginate, sodium alginate, etc.

(3) Starch Based Polymers

A preferably used starch based polymer is obtained by graft-polymerizing a synthetic monomer such as acrylic acid to water soluble starch, to prepare a higher molecular polymer, and three-dimensionally crosslinking it.

For example, starch-acrylonitrile graft polymer hydrolysate is highly hydrophilic since it has a structure, in which acrylic acid derivative chains with ionic groups branch from the starch trunk. In addition, the radical-polymerized terminals of acrylonitrile cause coupling reaction during graft polymerization, to form a three-dimensionally crosslinked structure among polymer chains. Moreover, a polymer obtained by mixing said polymer with a polymer with ionic groups reverse in sign to the grafted ionic groups (a polymer with cationic groups if the grafted chains are anionic) to form a poly-ion complex enhanced in gel intensity can also be preferably used.

(4) Cellulose Based Polymers

A cellulose based polymer three-dimensionally crosslinked by graft polymerization as in the case of a starch based polymer can be preferably used. Furthermore, as disclosed in Japanese Patent Laid-Open (Kokai) No. 61-89364, crosslinked carboxy cellulose sodium salt can also be preferably used.

Cellulose based polymers include, for example, carboxylated methyl cellulose, methyl cellulose, hydroxypropylmethyl cellulose, hydroxyethyl cellulose, cellulose xanthogenate, etc.

(5) Hyaluronic Acid Based Polymers

Polymers of natural polysaccharides as disclosed in Japanese Patent Publication (Kokoku) 61-8083, Japanese Patent Laid-Open (Kokai) Nos. 58-56692, 60-49797, etc. can be preferably used.

(6) Polyvinyl Alcohol Based Polymers

Polyvinyl alcohol alone is rather weak in water absorbability. Usually a polymer obtained by saponifying methyl acrylate-vinyl acetate copolymer, to have ionic hydrophilic groups introduced, and three-dimensionally crosslinking it can be preferably used. Furthermore, a hydrophilic elastomer obtained by repetitively freezing and thawing polyvinyl alcohol as disclosed in Japanese Patent Laid-Open No. 58-61744 can also be used. Blends with another polymer can also be used.

(7) Acrylates

In view of water absorbability and durability, a crosslinking product of a polymer containing, as a monomer component, an $\alpha$, $\beta$-unsaturated compound with one or two carboxyl groups or groups capable of being converted into carboxyl groups such as carboxylate, carboxylic acid amide, carboxylic acid imide or carboxylic anhydride in the molecule can be preferably used.

The $\alpha$, $\beta$-unsaturated compound can be selected, for example, from acrylic acid, methacrylic acid, acrylic acid amide, methacrylic acid amide, maleic anhydride, maleic acid, maleic acid amide, maleic acid imide, itaconic acid, crotonic acid, fumaric acid, mesaconic acid, etc. Any of these compounds can also be combined with another copolymerizable monomer as far as the hydrophilicity required in the present invention is secured. The other copolymerizable monomer can be selected, for example, from $\alpha$-olefins such as ethylene, propylene, isobutylene, 1-butylene, diisobutylene, methyl vinyl ether, styrene, vinyl acetate, acrylates, methacrylates, and acrylonitrile, vinyl compounds, vinylidene compounds, etc. When combined with another monomer, the α, β-unsaturated compound with one or two carboxyl groups or groups capable of being converted into carboxyl groups in the molecule is usually contained by 10 mol % or more, preferably 40 mol % or more in all the monomers.

A polymer containing the α,β-unsaturated compound with one or two carboxyl groups or groups capable of being converted into carboxyl groups in the molecule is usually prepared by radical polymerization. The polymerization degree is not especially limited.

Among the polymers prepared like this, especially homopolymers of acrylic acid and methacrylic acid, copolymer of acrylic acid and methacrylic acid, copolymers of maleic anhydride with an α-olefin or vinyl compound are preferable.

Any of these homopolymers and copolymers can be caused to react with the hydroxide, oxide or carbonate, etc. of an alkali metal or alkaline earth metal such as sodium, potassium, magnesium or barium, ammonia or amine, etc., to be preferably enhanced in hydrophilicity. The reaction is effected by dissolving or dispersing any of the homopolymers and copolymers into any of various organic solvents or water, and adding any of said alkali metal compounds, alkaline earth metal compounds, ammonia, amines, etc. with stirring.

(8) Other Polymers

Poly(vinyl methyl ether-co-maleic anhydride), vinylpyrrolidone copolymers, polyacrylamide, acrylamide copolymers, N-vinylcarboxylic acidibased polymers, polyethylene oxide, poly(ethylene oxide-co-propylene oxide), gum arabic, tragacanth gum, karaya gum, guar gum, locust bean gum, Irish moss, pectic acid, agar, dextrin, mannan, etc.

Examples of the hydrophilic polymer preferably used in the present invention are enumerated below, but the present invention is not limited thereto or thereby.

(1) Polymers obtained by letting a copolymer between maleic acid or maleic acid derivative such as maleic anhydride, maleic acid amide or maleic acid imide and a straight chain or branched chain α-olefin with 2 to 12 carbon atoms, preferably 2 to 8 carbon atoms such as ethylene, propylene, butylene, isobutylene or diisobutylene react with an alkali metal compound, alkaline earth metal compound, ammonia or amine, and crosslinking the reaction product.

(2) Polymers obtained by letting a copolymer between maleic acid or maleic acid derivative and a vinyl or vinylidene compound such as vinyl acetate, methyl vinyl ether, acrylate, methacrylate or acrylonitride react with an alkali metal compound, alkaline earth metal compound, ammonia or amine, and crosslinking the reaction product.

(3) Polymers obtained by letting a copolymer between acrylic acid or methacrylic acid and any of the vinyl and vinylidene compounds stated in the above (2) react with an alkali metal compound, alkaline earth metal compound, ammonia or amine, and crosslinking the reaction product.

Polyoxyalkylene based hydrophilic polymers disclosed in Japanese Patent Laid-Open (Kokai) No. 58-37027, etc., polyvinyl pyrrolidone, polystyrenesulfanic acid with sulfanate groups as hydrophilic groups, acrylamide methylpropanesulfonic acid copolymer, etc. respectively crosslinked, disclosed in Japanese Patent Laid-Open (Kokai) No. 60-104106, etc., polyurethane resins obtained by crosslinking a polyisocyanate with a hydrophilic polymer with hydroxyl groups and amino groups, disclosed in JP-A-60-42416, etc.

One or more as a mixture of these hydrophilic polymers can be used in the present invention.

The hydrophobic polymer used in the hydrophilic swellable resin layer of the present invention is described below.

As the hydrophobic polymer used in the present invention, a hydrophobic polymer mainly composed of an aqueous emulsion can be preferably used.

The aqueous emulsion in the present invention means a hydrophobic polymer-suspended aqueous solution, in which fine polymer grains or as required, grains each consisting of a fine polymer grain and a protective layer surrounding it are dispersed in water.

That is, it means a self emulsified or forcibly emulsified aqueous solution basically consisting of polymer grains, or as required polymer grains respectively covered with a protective layer as a dispersed phase and a diluting aqueous solution as a dispersion medium. The aqueous emulsion used in the present invention can be selected, for example, from vinyl polymer based latexes, conjugated diene polymer based latexes, and aqueous or water dispersed polyurethane resins, etc.

The vinyl polymer based latexes include acrylic latexes, vinyl acetate based latexes, vinyl chloride based latexes, styrene based latexes, etc. The conjugated diene polymer based latexes include styrene/butadiene based (hereinafter abbreviated as SB based) latexes, acrylonitrile/butadiene based (hereinafter abbreviated NB based) latexes, methyl methacrylate/butadiene based (hereinafter abbreviated as MB based) latexes, chloroprene based latexes, etc.

The acrylic latexes include copolymers with an acrylate or methacrylate as an essential component, for example, copolymers of at least one or more of methyl methacrylate, ethyl acrylate, butyl acrylate, octyl acrylate, 2-ethylhexyl acrylate, styrene, etc.

The vinyl acetate based latexes include vinyl acetate homopolymer, and copolymers of vinyl acetate with an acrylate, higher vinyl acetate, or ethylene, etc.

The vinylidene chloride based latexes include copolymers of vinylidene chloride with methyl acrylate, octyl acrylate, 2-ethylhexyl acrylate, acrylonitrile, or vinyl chloride, etc.

The SB based latexes include copolymers of styrene and butadiene as essential components with methyl methacrylate, higher acrylate, acrylonitrile, acrylamide, hydroxyethyl acrylate, or unsaturated carboxylic acid (itaconic acid, maleic acid, acrylic acid, or methacrylic acid, etc.).

The aqueous or water dispersed polyurethane resins include forcibly emulsified polyurethane resins obtained by forcibly emulsifying a hydrophobic polyurethane resin consisting of a polyester polyol, polyether polyol or poly(ester/ether) polyol, and a polyisocyanate using a surfactant, and self emulsified polyurethane resins obtained by adding hydrophilic groups or a hydrophilic segment to the resin itself for self dispersion. Both types of the resins can be either non-reactive resins or reactive resins with reactive groups such as isocynate groups blocked by a blocking agent.

Among these aqueous emulsions, the hydrophobic polymers especially preferably used in the present invention are latexes with a conjugated diene based compound such as SB based latexes, NB bases latexes, MB based latexes, and chloroprene based latexes.

The conjugated diene based rubbers stated above mean compounds with a non-substituted or substituted 1,3-butadiene skeleton with a carbon-carbon double bond at the 1,3-positions such as 1,3-butadiene, 2-methyl-1,3-butadiene (isoprene), 2,3-dimethyl-1,3-butadiene, and 2-chloro,-1,3-butadiene (chloroprene)., and include homopolymer rubbers and block copolymer rubbers with any of these as essential components.

The block copolymer rubbers include block copolymers between a 1,3-diene such as 1,3-butadiene, or 2-methyl-1,3-butadiene (isoprene), and a monovinyl substituted aromatic compound to provide a glassy polymer at room temperature such as styrene, α-methylstyrene, or vinyltoluene.

Such copolymer rubbers include various conventional types. Among them, an A-B-A type block copolymer rubber (where A means a polymer segment consisting of a monovinyl substituted aromatic compound, preferably of 70° C. or higher in glass transition point and 10 to 2500 in polymerization degree, and B means a 1,3-diene, preferably an amorphous polymer segment of 500 to 25000 in number average molecular weight) is preferable. These block copolymer rubbers hydrogenated can also be used.

The homopolymer and copolymer rubbers used in the present invention include, for example, polybutadiene, polyisoprene (including natural rubber), polychloroprene, styrene-butadiene copolymer, carboxy modified styrene-butadiene copolymer, acrylate-butadiene copolymer (e.g., butadiene-2-ethylhexyl acrylate copolymer, butadiene-n-octadecyl acrylate copolymer), methacrylate-butadiene copolymer, isobutylene-isoprene copolymer, acrylonitrile-butadiene copolymer, carboxy modified acrylonitrile-butadiene copolymer, acrylonitrile-isoprene copolymer, vinylpyridine-butadiene copolymer, vinylpyridine-styrene-butadiene copolymer, styrene-chloroprene copolymer, styrene-isoprene copolymer, etc.

The conjugated diene polymer based latex preferably used in the present invention can be produced by a conventional method, for example, by emulsifying a vinyl monomer composition containing a conjugated diene based compound as an essential component in a water medium containing 0.1 to 20 wt % of an emulsion polymerization dispersing agent (a surfactant, etc.) and 2 to 50 wt % of water, respectively based on the weight of the vinyl monomer compound, with the atmosphere substituted by nitrogen, as required, adding additives (molecular weight regulator, antioxidant, etc.) usually used for emulsion polymerization, adding an emulsion polymerization initiator (e.g., hydrogen peroxide or potassium persulfate, etc.), and emulsion-polymerizing according to a conventional method.

The vinyl monomers used in addition to the conjugated diene based compound in the raw vinyl monomer composition are not especially limited, but can be mainly classified into the following three groups; Group I (hydrophobic monomers), Group II (hydrophilic monomers), and Group III (crosslinkable monomers).

Group I: A hydrophobic monomer refers to a hydrophobic vinyl monomer with one vinyl group (hydrophobicity in this case means that the solubility in water at 20° C. is 8 wt % or less). Hydrophobic monomers include acrylates, methacrylates, vinyl esters, styrenes, olefins, etc.

The acrylates include, for example, methyl acrylate, ethyl acrylate, n-propyl acrylate, isopropyl acrylate, n-butyl acrylate, isobutyl acrylate, sec-butyl acrylate, amyl acrylate, hexyl acrylate, 2-ethylhexyl acrylate, octyl acrylate, 2-phenoxyethyl acrylate, 2-chloroethyl acrylate, benzyl acrylate, cyclohexyl acrylate, tetrahydrofurfuryl acrylate, phenyl acrylate, 2-methoxyethyl acrylate, 2-ethoxyethyl acrylate, etc.

The methacrylates include, for example, methyl methacrylate, ethyl methacrylate, n-propyl methacrylate, isopropyl methacrylate, n-butyl methacrylate, isobutyl methacrylate, sec-butyl methacrylate, amyl methacrylate, hexyl methacrylate, cyclohexyl methacrylate, benzyl methacrylate, acetacetoxyethylethyl methacrylate, chlorobenzyl methacrylate, octyl methacrylate, furfuryl methacrylate, tetrahydrofurfuryl methacrylate, phenyl methacrylate, trimethylolpropane monomethacrylate, 2-methoxyethyl methacrylate, 2-ethoxyethyl methacrylate, etc.

The vinyl esters include, for example, vinyl acetate, vinyl propionate, vinyl butyrate, vinyl chloroacetate, vinyl dichloroacetate, vinyl methoxyacetate, vinyl acetacetate, vinyl benzoate, vinyl salicylate, vinyl chlorobenzoate etc.

The styrenes include, for example, styrene, α-methylstyrene, chloromethylstyrene, trifluormethylstyrene, acetoxymethylstyrene, methoxystyrene, chlorostyrene, dichlorostyrene, trichlorostyrene, bromostyrene, etc.

The olefins include, for example, propylene, vinyl chloride, vinyl bromide, vinylidene chloride, vinylidene bromide, vinylidene fluoride, etc. Acrylonitrile, maleic anhydride, etc. are also included.

Group II: A hydrophilic monomer refers to a hydrophilic vinyl monomer with one vinyl group (the hydrophilicity in this case means that solubility in water is too large to allow aqueous emulsion polymerization of the monomer alone). Hydrophilic monomers include monomers with a functional group such as amino group, carboxyl group, sulfonic acid group, amide group, or hydroxyl group, etc.

The monomers with an amino group include, for example, dimethylaminomethyl acrylate, dimethylaminomethyl methacrylate, diethylaminomethyl acrylate, diethylaminomethyl methacrylate, tert-butylaminoethyl acrylate, tert-butylaminoethyl methacrylate, etc.

The monomers with a carboxyl group include, for example, acrylic acid, methacrylic acid, itaconic acid, maleic acid, crotonic acid, fumaric acid, methylenemalonic acid, monoalkyl itaconates (e.g., monomethyl itaconate, monoethyl itaconate, monobutyl itaconate, etc.), monoalky maleates (e.g., monomethyl maleate, monoethyl maleate, monobutyl maleate, etc.), citraconic acid, sodium acrylate, ammonium acrylate, ammonium methacrylate, etc.

The monomers with a sulfone group include, for example, styrenesulfonic acid, vinylbenzylsulfonic acid, vinylsulfonic acid, acryloyloxyalkylsulfonic acids (e.g., acryloyloxymethylsulfonic acid, acryloyloxypropylsulfonic acid, acryloyloxybutylsulfonic acid, etc.), methacryloyloxyalkylsulfonic acids (e.g., methacryloyloxymethylsulfonic acid, methacryloyloxypropylsulfonic acid, methacryloyloxybutylsulfonic acid, etc.), acrylamidealkylsulfonic acids (e.g., 2-acrylamide-2-methylethanesulfonic acid, 2-acrylamide-2-methylpropanesulfonic acid, 2-acrylamide-2-methylbutanesulfonic acid, etc.), methacrylamidealkylsulfonic acids (e.g., 2-methacrylamide-2-methylethanesulfonic acid, 2-methacrylamide-2-methylpropanesulfonic acid, 2-methacrylamide-2- methylbutanesulfonic acid, etc.).

The monomers with an amide group include, for example, acrylamide, methylacrylamide, propylacrylamide, etc.

The monomers with a hydroxyl group include, for example, allyl alcohol, 2-hydroxyethyl acrylate, 2-hydroxyethyl methacrylate, 2-hydroxypropyl acrylate, 2-hydroxypropyl methacrylate, aryl ethers of polyhydric alcohols, etc.

N-acryloylpiperidine, vinylpyridine, vinylpyrrolidone, etc. are also included.

Group III: Crosslinkable monomers include monomers with a reactive crosslinking group (glycidyl group, hydroxymethylamide group, alkoxymethylamide group, acyloxymethylamide group, isocyanate group, etc.), and polyfunctional monomers with two or more vinyl groups.

The monomers with a glycidyl group include, for example, glycidyl acrylate, glycidyl methacrylate, glycidyl p-vinylbenzoate, glycidyl crotonate, diglycidyl itaconate, diglycidyl maleate, diglycidyl methylenemalonate, glycidyl vinyl ether, allyl glycidyl ether, glycidyl-α-chloroacrylate, etc.

The monomers with a hydroxymethylamide group include, for example, hydroxymethylacrylamide, hydroxymethylmethacrylamide, etc.

The monomers with an alkoxyemthylamide group include, for example, methoxymethylacrylamide, methoxymethylmethacrylamide, ethoxymethylacrylamide, ethoxymethylmethacrylamide, butoxymethylacrylamide, butoxymethylmethacrylamide, hexyloxymethylmethacrylamide, etc.

The monomers with an acyloxymethylamide group include, for example, acetoxymethylacrylamide, acetoxymethylmethacrylamide, propionyloxyiethylacrylamide, etc.

The monomers with an isocyanate group include, for example, vinyl isocyanate, allyl isocyanate, etc.

The polyfunctional monomers include, for example, divinylbenzene, polyethylene glycol diacrylate (n=1~23 in the number of ethylene groups), polyethylene glycol dimethacrylate (n=1~23 in the number of ethylene groups), trimethylolpropane triacrylate, trimethylolpropane trimethacrylate, pentaerythritol triacrylate, etc.

Proper combinations of monomers for preparing the conjugated diene polymer based latexes preferably used in the present invention include a conjugated diene based compound as an essential component, and (1) at least one or more monomers of group I as the other component of a copolymer, or (2) at least one or more monomers of group I and at least one or more monomers of group II as the other components of a copolymer, or (3) at least one or more monomers of group I, at least one or more monomers of group II and at least one or more monomers of group III as the other components of a copolymer, (4) at least one or more monomers of group II and at least one or more monomers of group III as the other components of a copolymer The present invention is not limited to or by these combinations.

The conjugated diene polymer based latexes preferably used in the present invention include, for example, JSR0561 (SB copolymer latex produced by Japan Synthetic Rubber Co., Ltd.), JSR0589 (SB copolymer latex produced by Japan Synthetic Rubber Co., Ltd.), JSR0602 (SB copolymer latex produced by Japan Synthetic Rubber Co., Ltd.), JSR0700 (copolymer latex produced by Japan Synthetic Rubber Co., Ltd.), JSR2108 (SB copolymer latex produced by Japan Synthetic Rubber Co., Ltd.), JSR0650 (vinylpyridine-SB copolymer latex produced by Japan Synthetic Rubber Co., Ltd.), JSR0652 (vinylpyridine-SB copolymer latex produced by Japan Synthetic Rubber Co., Ltd.), JSR0545 (carboxy modified SB copolymer latex produced by Japan Synthetic Rubber Co., Ltd.), JSR0548 (carboxy modified SB copolymer latex produced by Japan Synthetic Rubber Co., Ltd.), JSR0596 (carboxy modified SB copolymer latex produced by Japan Synthetic Rubber Co., Ltd.), JSR0597 (carboxy modified SB copolymer latex produced by Japan Synthetic Rubber Co., Ltd.), JSR0598 (carboxy modified SB copolymer latex produced by Japan Synthetic Rubber Co., Ltd.), JSR0619 (carboxy modified SB copolymer latex produced by Japan Synthetic Rubber Co., Ltd.), JSR0624 (carboxy modified SB copolymer latex produced by Japan Synthetic Rubber Co., Ltd.), JSR0640 (carboxy modified SB copolymer latex produced by Japan Synthetic Rubber Co., Ltd.), JSR0693 (carboxy modified SB copolymer latex produced by Japan Synthetic Rubber Co., Ltd.), JSR0696 (carboxy modified SB copolymer latex produced by Japan Synthetic Rubber Co., Ltd.), JSR0854 (carboxy modified SB copolymer latex produced by Japan Synthetic Rubber Co., Ltd.), JSR0863 (carboxy modified SB copolymer latex produced by Japan Synthetic Rubber Co., Ltd.), JSR0898 (carboxy modified SB copolymer latex produced by Japan Synthetic Rubber Co., Ltd.), Lacstar-4940B (carboxy modified NB copolymer latex produced by Dainippon Ink & Chemicals, Inc.), Lacstar-68-073S (carboxy modified NB copolymer latex produced by Dainippon Ink & Chemicals, Inc.), Lacstar-DN-704 (carboxy modified NB copolymer latex produced by Dainippon Ink & Chemicals, Inc.), Lacstar-DN-702 (carboxy modified NB copolymer latex produced by Dainippon Ink & Chemicals, Inc.), Lacstar-68-074 (carboxy modified NB copolymer latex produced by Dainippon Ink & Chemicals, Inc.), Lacstar-DN-703 (carboxy modified NB copolymer latex produced by Dainippon Ink & Chemicals, Inc.), Lacstar-DM-801 (carboxy modified MB copolymer latex produced by Dainippon Ink & Chemicals, Inc.), Lacstar-DM-401 (carboxy modified MB copolymer latex produced by Dainippon Ink & Chemicals, Inc.), Lacstar-4950C (carboxy modified MB copolymer latex produced by Dainippon Ink & Chemicals, Inc.), Lacstar-DM-806 (carboxy modified MB copolymer latex produced by Dainippon Ink & Chemicals, Inc.), etc.

One or more as a proper mixture of these conjugated diene polymer based latexes can be used.

The hydrophilic swellable layer of the present invention is formed by mixing any of the above hydrophilic polymers and any of the above hydrophobic polymers, as required, crosslinking or pseudo-crosslinking the mixture, to make it insoluble in water, and laminating it on a substrate.

For crosslinking, it is preferable to use the reactive functional groups of the hydrophilic polymer and the hydrophobic polymer, for crosslinking reaction.

The crosslinking reaction can be either covalent-bonded crosslinking or ionic-bonded crosslinking.

The compound used for the crosslinking reaction is a known crosslinkable polyfunctional compound, and can be selected from polyepoxy compounds, polyisocyanate compounds, polyacrylic compounds, polymethacrylic compounds, polymercapto compounds, polyalkoxysilyl compounds, polyvalent metal salt compounds, polyamine compounds, aldehyde compounds, polyvinyl compounds, hydrazine, etc. The crosslinking reaction can be promoted by adding a known catalyst.

When an aqueous emulsion preferably used as a hydrophobic polymer in the present invention is produced, reactive functional groups such as carboxyl groups, hydroxyl groups, methylolamide groups, epoxy groups, carbonyl groups, or amino groups can be arranged to exist as a comonomer for self crosslinking, or any of these polyfunctional compounds can be used as a crosslinking agent for forming a crosslinked structure.

Known crosslinkable polyfunctional compounds include, for example, the following compounds.

(1) Sublimed sulfur, sulfur byproduced by oxidation of hydrogen sulfide, colloidal sulfur produced by wet oxidation of hydrogen sulfide, etc. Compounds which can be decomposed to generate sulfur when heated, for example, thiuram based compounds such as dithiomorpholine, tetramethylthiuram monosulfide, and dipentamethylenethiuram tetrasulfide, dithiocarbamate based compounds such as piperidinepentamethylene thiocarbamate, pipecolinepipecolyl dithiocarbamate, and sodium dimethyldithiocarbamate, xanthate compounds such as sodium isopropylxanthate, and zinc butylxanthate, thiourea compounds such as thiourea, and thiocarbanilide, thiazole based compounds such as zinc salt of thiazole, sodium salt of mercaptobenzothiazole, dibenzothiazyl disulfide, and cyclohexylamine salt of mercaptobenzothiazole, etc.

(2) Aldehyde amine based compounds such as butylaldehyde-monobutylamine condensation product, butylaldehyde-aniline condensation product, heptaaldehyde-aniline reaction product, and ethyl chloride-formaldehyde-ammonia reaction product, zinc oxide, tellurium, selenium, zirconium carbonate, ammonia, organic peroxides such as benzoyl peroxide, dicumyl peroxide, etc.

The crosslinking accelerator can be selected from zinc carbonate, stearic acid, oleic acid, lauric acid, zinc stearate, dibutylarrimonium oleate, diethanolamine, triethanolamine, diethylene glycol, etc.

(3) Polyepoxy-compounds, urea resin, polyamines, melamine resin, benzoguanamine resin, acid anhydrides.

The polyepoxy compounds include, for example, glycerol polyglycidyl ether, polyethylene glycol diglycidyl ether, polypropylene glycol diglycidyl ether, trimethyloipropane polyglycidyl ether, trimethylolpropane polyglycidyl ether, sorbitol polyglycidyl ether, etc.

The polyamines include, for example, ethylenediamine, diethylenetriamine, triethylenetetramine, tetraethylenepentamine, polyethyleneimine, polyamideamine, etc.

(4) Polyisocyanate compounds, etc.

The polyisocyanate compounds include, for example, tolylene diisocyanate, hexamethylene diisocyanate, diphenylmethane isocyanate, liquid diphenylmethane diisocyanate, polymethylenepolyphenyl isocyanate, xylylene diisocyanate, cyclohexyl diisocyanate, cyclohexanephenylene diisocyanate, naphthalene-1,5-diisocyanate, isopropylbenzene-2,4-diisocyanate, polypropylene glycol/tolylene diisocyanate addition product, etc.

One or more as a mixture of these crosslinking agents can be used.

As the dispersion medium,.water is mainly used. As required, a known organic solvent can be added. The organic solvent can be added as a polymerization solvent, or as a mixed solvent into the emulsion solution after completion of emulsion polymerization.

The hydrophilic polymer and the hydrophobic polymer of the hydrophilic swellable layer of the present invention can be mixed by any conventional method used for producing a paint or putty, for example, kneading by use of a three-roll mixer or any other roller mixer, or a kneader, etc., or wet mixing dispersion by use of a disperser such as a homogenizer or ball mill, etc.

For forming the hydrophilic swellable layer of the present invention, since it is preferable to use an aqueous emulsion as the hydrophobic polymer, it is preferable to mix the respective ingredients (hydrophilic polymer, hydrophobic polymer, etc.) in an aqueous solution and, as required, to add a crosslinking agent, because a homogeneously phase separated structure can be formed and because the ink repellency can be improved.

Therefore, as the crosslinking agent, it is especially preferable to use a water soluble polyfunctional compound such as a water soluble polyepoxy compound, polyamine compound, or melamine compound, etc.

The phase separated structure of the hydrophilic swellable layer in the present invention is described below.

The hydrophilic swellable layer used in the present invention has characteristically a phase separated structure composed of at least two phases: a phase mainly composed of said hydrophilic polymer and a phase mainly composed of said hydrophobic polymer.

The phase separated structure consisting of a phase mainly composed of the hydrophilic polymer and a phase mainly composed of the hydrophobic polymer can achieve both the intended ink repellency and the intended printing durability in a wide composition range.

The ratio of the hydrophilic polymer phase and the hydrophobic polymer phase constituting the phase separated structure is free, and can be freely selected from the structural types:

(1) Either phase is continuous while the other phase is dispersed.
(2) The hydrophilic polymer and the hydrophobic polymer are respectively continuous and dispersed.
(3) Both the hydrophilic polymer and the hydrophobic polymer are continuous.

Figure 2:
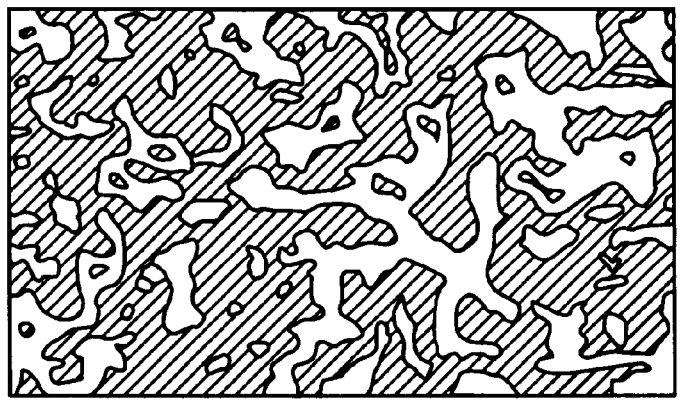
FIG. 2 is a typical view showing another example of the phase-separated structure of the hydrophilic swellable layer in the lithographic printing plate of the present invention.
Figure 3:
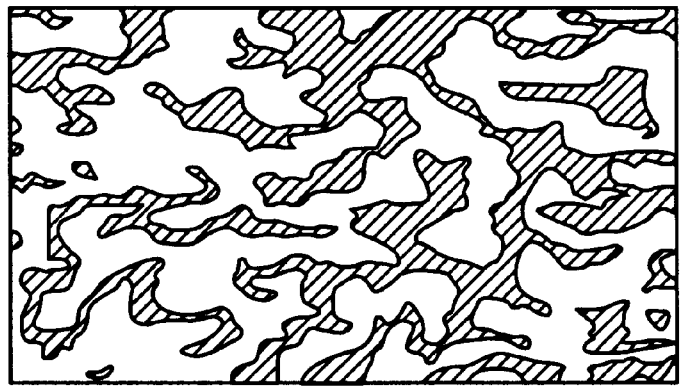
FIG. 3 is a typical view showing a further other example of the phase-separated structure of the hydrophilic swellable layer in the lithographic printing plate of the present invention.

Examples of the types (1) to (3) of the phase separated structure are shown in FIGS. 1 to 3.

When the hydrophilic polymer selected is a material showing relatively powerful hydrophilicity (a water soluble polymer or pseudo water soluble polymer, etc.), the amount of the hydrophilic polymer contained in the hydrophilic swellable layer can be relatively small in view of ink repellency and printing durability, and the amount of the hydrophobic polymer becomes relatively large. So, it is preferable to adopt the above type (1) or (2) where the hydrophilic polymer is dispersed. On the other hand, when the hydrophilic polymer selected is a material showing relatively weak hydrophilicity (water swellable polymer, etc.), the amount of the hydrophilic polymer contained in the hydrophilic swellable layer must be relatively large in view of ink repellency and printing durability, and the amount of the hydrophobic polymer is relatively small. So, it is preferable to adopt the above type (1), (2) or (3).

The preferable phase separated structure of the hydrophilic swellable layer used in the present invention depends on the degree of the hydrophilicity of the hydrophilic polymer, though depending on the rubber resiliency and water swellability of the layer.

To make the hydrophobic polymer mainly continuous in type (1), the amount of the hydrophobic polymer must be 50 wt %, preferably 60 to 95 wt %, more preferably 70 to 90 wt %. If the amount of the hydrophobic polymer is less than 50 wt %, the printing durability tends to be extremely lowered even though the performance of the hydrophilic swellable layer as an ink repellent layer is better in the initial stage of printing. On the other hand, if the amount of the hydrophobic polymer is more than 95 wt %, the hydrophilic polymer in the hydrophilic swellable layer cannot absorb water sufficiently, and the ink repellency tends to be lowered extremely due to insufficient hydrophilicity.

To adopt the type (2) or (3), it is preferable that both the hydrophilic polymer and the hydrophobic polymer are contained by 20 wt % or more, preferably 40 wt % or more respectively.

The hydrophilic swellable layer is preferably rubber-resilient.

The rubber resiliency of the hydrophilic swellable layer can be characterized by the initial modulus measured according to the following method.

[Method for Measuring the Initial Modulus of the Hydrophilic Swellable Layer]

Solutions identical in chemical composition to the non-image area and the image area of the lithographic printing plate to be measured are developed on a teflon dish, and dried and hardened at 60° C., taking 24 hours. The hardened film is cut using a razor blade, etc., to obtain a test piece of 40 mm in length, 1.95 mm in width and about 0.2 mm in thickness. If the printing plate is processed to make a machine plate after solution coating, the test piece is also processed similarly.

The test piece obtained is allowed to stand in an environment of 25° C. 50% RH for 24 hours or more before measurement, and the thickness is measured by a micro-gauge. Then, the initial modulus is measured under the following tensile conditions. The data are processed according to JIS K 6301.

Tensile speed: 200 mm/min

Inter-chuck distance: 20 mm

Number of repetitions: 4

Measuring instrument: RTM-100 produced by K.K. Orienteck

In view of ink repellency and form retainability, the initial modulus of the hydrophilic swellable layer used in the present invention is preferably in a from 0.01 to 10 kgf/mm$^2$, more preferably 0.01 to 5 kgf/mm$^2$, further more preferably 0.01 to 2 kgf/mm$^2$.

If the initial modulus is less than 0.01 kgf/mm$^2$, the form retainability of the hydrophilic swellable layer becomes extremely low, and the durability during printing tends to be extremely low. On the other hand, if the initial modulus is larger than 10 kgf/mm$^2$, the rubber resiliency is insufficient, and the ink repellency tends to be remarkably low.

It is necessary that the initial modulus of the image area (to be inked) is larger than that of the non-image area in the hydrophilic swellable layer, and should be twice or more, preferably 3 times or more for advantageous image formation.

The water absorption of the hydrophilic swellable layer used in the present invention, measured according to the following definition, is preferably in a specific range.

Water absorption (%)=Water absorbability (g/m$^2$)/Thickness of hydrophilic swellable layer (g/m$^2$)×100

In the above formula, the water absorbability means the value measured according to the following definition.

Water absorbability (g/m$^2$)=$^W$WET−$^W$DRY $^W$DRY: Weight in dry state (g/m$^2$)

$^W$WET: Weight after immersing in water at 25° C. for 10 minutes (g/m$^2$)

[Method for Measuring the Water Absorbability]

From portions formed respectively by the non-image area and the image area only of the lithographic printing plate to be measured, test pieces with a predetermined area are respectively cut out and immersed in 25° C. purified water for 10 minutes. Then, the extra water deposited on the respective obverse and reverse sides of test pieces of the lithographic printing plate are quickly wiped off by "Hize Gauze" (cotton fabric produced by Asahi Chemical Industry Co., Ltd.), and the swollen weights $^W$WET of the test pieces are weighed. Then, they are dried in a 60° C. oven for about 30 minutes, and their dry weights $^W$DRY are weighed.

The hydrophilic swellable layer used in the present invention can be 10 to 2000% in the water absorption, but preferably 50 to 1700%, more preferably 50 to 700% in view of ink repellency and form retainability. If the water absorption is less than 10%, the ink repellency tends to be remarkably low, and defects such as pinholes are likely to be caused during coating. If larger than 2000%, the form retainability tends to be extremely low.

It is important in view of ink repellency and form retainability, that the water absorbability of the non-image area (ink repelling portion) of the hydrophilic swellable layer is 1 to 50 g/m$^2$, preferably 1 to 10 g/m$^2$, more preferably 2 to 7 g/m$^2$. If the water absorbability of the non-image area of the hydrophilic swellable layer is less than 1 g/m$^2$, the ink repellency is insufficient, and scumming is liable to occur during printing. On the other hand, if the water absorbability exceeds 50 g/m$^2$, the form retainability becomes remarkably low, to lower the durability of the printing plate.

The water absorbability of the image area must be less than that of the non-image area in view of image formation, preferably 50% or less, more preferably 30% or less of the water absorbability of the non-image area in view of advantageous image formation.

If the thickness of the hydrophilic swellable layer is larger, the water absorbability increases in a tendency to improve the ink repellency as far as the chemical composition remains the same.

When the hydrophilic swellable layer is formed using a material relatively low in the water absorption, the thickness of the layer must be large enough to achieve an water absorbability of 1 to 50 g/m$^2$, at which the effect of the present invention can be manifested. When the layer is formed using a material relatively high in the water absorption, the thickness of the layer can be small compared to the above case, to obtain equivalent ink repellency. Therefore, if a material excessively high in the water absorption is used to form the hydrophilic swellable layer, an water absorbability of 1 to 50 g/m$^2$, can be achieved, but the material is disadvantageous in view of form retainability during swelling.

For example, when a material of 10% in the water absorption is used to form the hydrophilic swellable layer, an water absorbability of 1 g/m$^2$ can be achieved by adopting 10 g/m$^2$ as the thickness of the hydrophilic swellable layer.

However, when a material of less than 10% in the water absorption is used, the thickness of the hydrophilic swellable layer must be larger. In the lithographic printing plate of the present, since the difference in the water absorbability between the image area and the non-image area of the hydrophilic swellable layer is characteristically realized by the photosensitive compound described below, the hydrophilic swellable layer with an excessively large thickness requires the photosensitive compound to be used in a large amount uneconomically, to realize the difference in the water absorbability.

The thickness of the hydrophilic swellable layer of the present invention means the value obtained by removing the coated hydrophilic swellable layer corresponding to the non-image area of the lithographic printing plate applied and dried on the substrate, and measuring the weight of the removed layer.

Thickness of hydrophilic swellable layer (g/m$^2$)=(W−W$_0$)/α

W: Dry weight of the portion corresponding to the non-image area only cut off from the lithographic printing plate (g)

$W_0$: Dry weight of the material remaining after removing the hydrophilic swellable layer from said portion with weight W α: Measured area of lithographic printing plate ($m^2$)

[Method for Measuring the Thickness of Hydrophilic Swellable Layer]

The portion corresponding to the non-image area only of the lithographic printing plate to be measured is cut to have a predetermined area α, and it is dried in a 60° C. oven for about 30 minutes, to weigh dry weight W. Then, the lithographic printing paper is immersed in purified water, to swell the hydrophilic swellable layer, and the swollen layer is removed using a scraper, etc. The lithographic printing plate remaining after removing the hydrophilic swellable layer is again dried in a 60° C. oven for about 30 minutes, to weigh dry weight $W_0$.

The thickness of the hydrophilic swellable layer used in the present invention can be 0.1 to 100 $g/m^2$, preferably 0.2 to 10 $g/m^2$ in view of ink repellency and form retainability. If the thickness is less than 0.2 $g/m^2$, the ink repellency tends to be extremely low, and defects such as pinholes are likely to be caused during coating. If more than 10 $g/m^2$, the form retainability during swelling with water tends to be deteriorated and uneconomical.

The water swelling ratios of the image area and the non-image area of the lithographic printing paper of the present invention are described below.

The lithographic printing paper of the present invention is characterized in that the non-image area of the hydrophilic swellable layer is substantially swollen by water absorption. Based on the swelling by water absorption, the hydrophilic swellable layer increases in thickness in the non-image area, and on the other hand, the image area is little or less swollen by water absorption than the non-image area. The, difference in water absorbability, i.e., the difference in the degree of swelling allows image formation.

The water swelling ratio in the present invention means a value measured according to the following definition.

Water swelling ratio (%)=(ΘWET−ΘDRY)/ΘDRY×100

ΘDRY: Thickness of the hydrophilic swellable layer in the non-image area or image area in dry state ΘWET: Thickness of the hydrophilic swellable layer in the non-image area or image area in wet state

[Method for Measuring Water Swelling Ratio (A)]

The lithographic printing plate to be measured is cut to obtain a slice including a section of the region containing the non-image area or image area. The slice is dried in vacuum at room temperature for a whole day and night, and the thickness of the hydrophilic swellable layer at the region is observed using an optical microscope, and adopted as ΘDRY (μm). The optical microscope observation is effected quickly in an environment of 23° C. and 20% RH.

Furthermore, on the slice of the lithographic printing plate, an excessive water drop is placed, to sufficiently swell the hydrophilic swellable layer by water. In this state, the section is observed using an optical microscope, and the thickness of the hydrophilic swellable layer at the region is read and adopted as ΘWET (μm).

[Method for Measuring Water Swelling Ratio (B)]

The lithographic printing plate to be measured (containing the non-image area or image area) is exposed to an atmosphere of $OsO_4$ aqueous solution for a whole day and night, to immobilize the hydrophilic swellable layer, and is cut by a microtome, to obtain a very thin slice including a section of a predetermined region. The slice is observed using a transmission electron microscope (TEM) at about 10,000 to 50,000 times, and the thickness of the hydrophilic swellable layer at the region observed is adopted as ΘDRY (μm).

On the other hand, the lithographic printing plate to be measured is immersed in $OsO_4$ aqueous solution for 2 or 3 days, to immobilize the hydrophilic swellable layer in the swollen state. It is cut by a microtome, to obtain a very thin slice including a section of a predetermined region, and the slice is observed using a transmission electron microscope (TEM) at about 10,000 to 50,000 times. The thickness of the hydrophilic swellable layer at the region read is adopted as ΘWET (μm).

The water swelling ratio of the non-image area (ink repelling portion) of the hydrophilic swellable layer of the present invention is preferably 10 to 2000%, more preferably 50 to 1700%, further more preferably 50 to 700% in view of ink repellency and form retainability. If the water swelling ratio is too small, the ink repellency of the non-image area is low, and if the water swelling ratio of the non-image area is too high, the non-image area is likely to be damaged during printing since the form retainability of the non-image area is low.

The water swelling ratio of the image area must be less than the water swelling ratio of the non-image area for the sake of image formation, being preferably 50% or less, more preferably 30% or less of the water swelling ratio of the non-image area for advantageous image formation.

Figure 5:
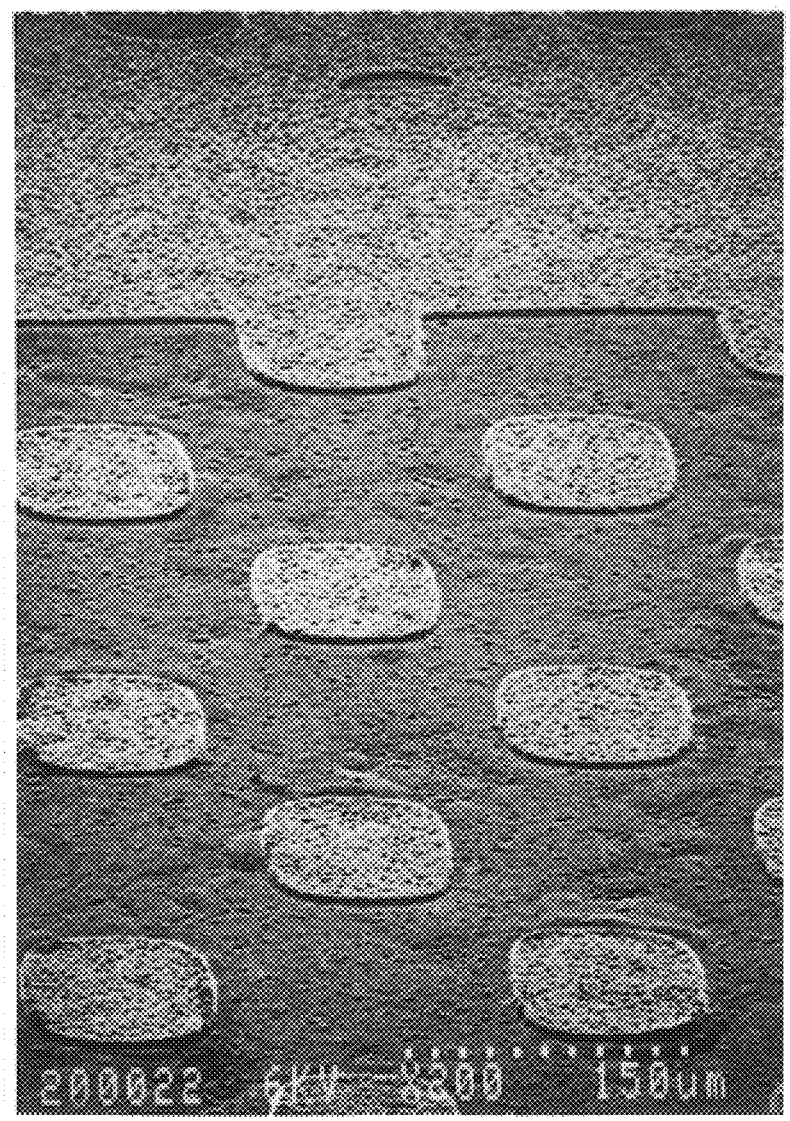
FIG. 5 is a scanning electron microscope photo showing, as an example, how the image area and the non-image area of the lithographic printing plate of the present invention look when they are swollen by water.

FIG. 5 is a scanning electron microscope (SEM) photo showing how the image area and the non-image area appear on the surface of the plate swollen by water. It can be seen that shadow dots are formed due to the difference in water swelling ratio.

The hydrophilic swellable layer used in the present invention can also contain a known antioxidant, antiozonant, ultraviolet absorbent, dye, pigment, plasticizer, etc. usually used in rubber compositions, in addition to the above mentioned hydrophilic polymer and hydrophobic polymer, and the crosslinking agent added as required.

The hydrophilic swellable layer may be heated-treated during or after its formation, to have any of various heat histories. The heat history may change the water absorbability, the water absorption, etc. of the hydrophilic swellable layer, even if it remains the same in chemical composition.

Furthermore, to improve the adhesiveness to the substrate, a known silane coupling agent, isocyanate, or catalyst, etc. can also be added to the hydrophilic swellable layer, or can be provided as an intermediate layer between the substrate and the hydrophilic swellable layer.

An example of the process for producing the lithographic printing plate of the present invention is described below, but the present invention is not limited thereto or thereby.

The image of the lithographic printing plate of the present invention can be formed, for example, by applying an active beam to the surface of the photosensitive lithographic original plate with the hydrophilic swellable layer provided on the substrate. That is, the difference between the image area and the non-image area is revealed by irradiation with an active beam.

The hydrophilic swellable layer of the photosensitive lithographic original plate is desirably equivalent to the non-image area in the lithographic printing plate in water absorbability, initial modulus, water swelling ratio, phase separated structure, thickness, water absorption, etc.

The lithographic printing plate of the present invention can be produced by the image formation of negative working. That is, since the initial modulus of the area irradiated with the active beam (hereinafter called the exposed area) in the hydrophilic swellable layer rises compared with that of the area not irradiated with the active beam (hereinafter called the non-exposed area), the exposed area becomes the image area capable of anchoring ink, and the non-exposed area becomes the non-image area repelling the ink.

For such image formation, a known photosensitive compound can be used.

That is, the hydrophilic swellable layer of the original plate is made to contain a photo-crosslinkable or photo-setting sensitive compound, and the exposed area is selectively crosslinked and/or set, to be raised in initial modulus, for achieving image formation.

Known photo-crosslinkable or photo-setting sensitive compounds include, for example, the compounds enumerated under the following (1) to (5).

(1) Photo-polymerizable Monomers and Oligomers

Methacrylates and acrylates of alcohols (ethanol, propanol, hexanol, octanol, cyclohexanol, glycerol, trimethyloapropane, pentaerythritol, isoamyl alcohol, lauryl alcohol, stearyl alcohol, butoxyethyl alcohol, ethoxyethylene glycol, methoxyethylene glycol, methoxypropylene glycol, phenoxyethanol, phenoxydiethylene glycol, tetrahydrofurfuryl alcohol, etc.), addition reaction products between a carboxylic acid (acetic acid, propionic acid, benzoic acid, acrylic acid, methacrylic acid, succinic acid, maleic acid, phthalic acid, tartaric acid, citric acid, etc.) and glycidyl acrylate, glycidyl methacrylate, tetraglycidyl-m-xylylenediamine or tetraglycidyl-m-tetrahydroxylylenediamine, amide derivatives (acrylamide, methacrylamide, n-methylolacrylamide, methylenebisacrylamide, etc.), addition reaction products between an epoxy compound and acrylic acid or methacrylic acid, etc.

Further examples include urethane acrylate stated in JP-B-48-41708 and 50-6034, and JP-A-51-37193, polyfunctional epoxy acrylates and methacrylates obtained by reaction among a polyester acrylate, epoxy resin and acrylic acid or methacrylic acid stated in JP-A-48-64183, and JP-B-49-43191 and 52-30490, N-methylolacrylamide derivatives stated in U.S. Pat. No. 4,540,649, etc. Moreover, the photo-setting monomers and oligomers introduced in Journal of the Adhesion Society of Japan Vol. 20, No. 7, p300~308 can also be used.

(2) Photo-dimerizable Photosensitive Resin Compositions

A photosensitive layer containing polyvinyl cinnamate, etc., for example, 1:1 polycondensed unsaturated polyester of P-phenylenediacrylic acid and 1,4-dihydroxyethyloxycyclohexane, photosensitive polyesters derived from cinnamylidenemalonic acid and a bi-functional glycol, and cinnamates of hydroxyl group-containing polymers such as polyvinyl alcohol, starch, and cellulose.

(3) Compositions Consisting of a Monomer, Oligomer or Polymer Respectively with Epoxy Groups, and a Known Photo Acid Generating Agent If any of these compositions is exposed to light, the photo acid generating agent produces a Lewis acid or BrØnsted acid, causing epoxy groups to be cation-polymerized for crosslinking. The photo acid generating agents used in the present invention include allyldiazonium salt compounds, diallyliodonium salt compounds, triallylsulfonium salt compounds, triallylselenonium salt compounds, dialkylphenacylsulfonium salt compounds, dialkyl-4-phenacylsulfonium salt compounds, α-hydroxymethylbenzoinsulfonate, N-hydroxyiminosulfonate, α-sulfonyloxy ketone, β-sulfonyloxy ketone, iron-allene complex compounds (benzene-cyclopentadienyl-iron (II) hexafluorophosphate, etc.), o-nitrobenzylsilyl ether compounds, etc.

The monomers, oligomers and polymers respectively with epoxy groups include preferably methyl glycidyl ether, ethyl glycidyl ether, propyl glycidyl ether, n-butyl glycidyl ether, isobutyl glycidyl ether, pentyl glycidyl ether, cyclohexyl glycidyl ether, 2-ethylhexyl glycidyl ether, etc.

(4) Compositions Consisting of a Monomer, Oligomer or Polymer Respectively with Allyl Groups and/or Vinyl Groups, and a Monomer, Oligomer or Polymer Respectively with Mercapto Groups If any of these compounds is exposed to light, the mercapto groups are added to the allyl groups and/or vinyl groups for crosslinking.

(5) Compositions Consisting of a Diazonium Salt Compound and a Hydroxy Group-containing Compound The diazo compounds used in the present invention include diazo resins insoluble in water and soluble in organic solvents such as the condensation product of p-diazodiphenylamine and formaldehyde.

These resins are stated in Japanese Patent Publication (Kokoku) Nos. 47-1167 and 57-43890.

The diazo monomers in the diazo resins preferably used in the present invention include, for example, 4-diazodiphenylamine, 1-diazo-4-N,N-dimethylaminobenzene, 1-diazo-4-N,N-diethylaminobenzene, 1-diazo-4-N-ethyl-N-hydroxyethylaminobenzene, 1-diazo-4-N-methyl-N-hydroxyethylaminobenzene, 1-diazo-2,5-diethoxy-4-benzoylaminobenzene, 1-diazo-4-N-benzylaminobenzene, 1-diazo-4-N,N-dimethylaminobenzene, 1-diazo-4-morpholinobenzene, 1-diazo-2,5-dimethoxy-4-p-tolylmercatobenzene, 1-diazo-2-ethoxy-4-N,N-dimethylaminobenzene, p-diazo-dimethylaniline, 1-diazo-2,5-dibutoxy-4-morpholinobenzene, 1-diazo-2,5-diethoxy-4-morpholinobenzene, 1-diazo-2,5-dimethoxy-4-morpholinobenzene, 1-diazo-2,5-diethoxy-4-p-tolylmercaptobenzne, 1-diazo-4-N-ethyl-N-hydroxyethylaminobenzene, 1-diazo-3-ethoxy-4-N-methyl-N-benzylaminobenzene, 1-diazo-3-chloro-4-diethylaminobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidinobenzene, 3-methoxy-4-diazodiphenylamine, 3-ethoxy-4-diazodiphenylamine, 3-(n-propoxy)-4-diazodiphenylamine, 3-(isopropoxy)-4-diazodiphenylamine,etc.

The aldehydes used as condensing agents with these diazo monomers include, for example, formaldehyde, acetaldehyde, propionaldehyde, butylaldehyde, isobutylaldehyde, benzaldehyde, etc.

Furthermore, if chlorine ions, or trichlorozincic acid, etc. is used as anions, a water soluble diazo resin can be obtained, and if boron tetrafluoride, hexafluorophosphoric acid, triisopropylnaphthalenesulfonic acid, 4,4'-biphenylsulfonic acid, 2,5-dimethylbenzenesulfonic acid, 2-nitrobenzenesulfonic acid, or 2-methoxy-4-hydroxy-5-benzoyl-benzenesulfonic acid, etc. is used, a diazo resin soluble in organic solvents can be obtained.

Any of these diazo resins is usually used as a mixture with any of the following high polymers with hydroxyl groups.

The high polymers with hydroxyl groups include copolymers between at least one or more monomers with an alcoholic hydroxyl group such as 2-hydroxyethyl acrylate, 4-hydroxybutyl acrylate, 2,3-hydroxypropyl acrylate, 2-hydroxyethylacrylamide, triethylene glycol monoacrylate, tetraethylene glycol monoacrylate, 1,3-propanediol monoacrylate, 1,4-butanediol monoacrylate, 2-hydroxyethyl methacrylate, 4-hydroxybutyl methacrylate, 2,3-hydroxypropyl methacrylate, 2-hydroxyethyl methacrylamide, triethylene glycol monomethacrylate, tetraethylene glycol monomethacrylate, 1,3-propanediol monomethacrylate, 1,4-butanediol monomethacrylate, di(2-hydroxyethyl) maleate, etc. and another monomer without any hydroxyl group, copolymers with a monomer with a phenolic hydroxyl group such as N-(4-hydroxyphenl) acrylamide, N-(4-hydroxyphenyl)methacrylamide, N-(4-hydroxyphenyl)maleimide, o-, m-, p-hydroxystyrene, o-, m-, p-hydroxyphenyl acrylate, or o-, m-, p-hydroxyphenyl methacrylate, and copolymers with a hydroxyl group-containing monomer, etc. such as ring opening reaction products between p-hydroxybenzoic acid and glycidyl acrylate or glycidyl methacrylate, and reaction products between salicylic acid and 2-hydroxyethyl acrylate or 2-hydroxyethyl methacrylate. Furthermore, polyvinyl alcohol, cellulose, polyethylene glycol, polypropylene glycol, glycerol, pentaerythritol, etc. and their epoxy added reaction products, and other hydroxyl group-containing natural high polymers, etc. can also be used.

(5) Photosensitive Compositions Mainly Composed of a Bisazide Compound and Cyclized Polyisoprene Rubber, Polybutadiene Rubber or Cresol Novolak Resin Any of these photosensitive compounds can be added to the hydrophilic swellable layer composition when the hydrophilic swellable layer is formed on the substrate, to exist in the layer, or can be applied onto the hydrophilic swellable layer already formed, for impregnation into the layer.

When a relatively high molecular polymer or oligomer, etc. is used as the photosensitive composition, the former method of adding simultaneously when the hydrophilic swellable layer is formed can be advantageously adopted, and when a relatively low molecular monomer or oligomer, etc. is used as the photosensitive composition, the latter impregnation method is advantageous.

To sensitize the photosensitive compound, a known photosensitizer can be added to the hydrophilic swellable layer of the original plate. The known photosensitizer can be freely selected from known photosensitizers. For example, various substituted benzophenone based compounds, substituted thioxanthone based compounds, substituted acridone based compounds, etc. can be preferably used. Further examples include the vicinal polyketaldonyl compounds stated in U.S. Pat. No. 236,766, α-carbonyl compounds disclosed in U.S. Pat. Nos. 2,367,661 and 2,367,670, aromatic acyloin compounds substituted by an α-hydrocarbon disclosed in U.S. Pat. No. 2,722,512, polynuclear quinone compounds disclosed in U.S. Pat. No. 2,951,758, combinations of a triarylimidazole dimer and a p-aminophenyl ketone disclosed in U.S. Pat. No. 3,549,367, benzothiazole based compounds disclosed in U.S. Pat. No. 3,870,524, benzothiazole based compounds/trihalomethyl-s-triazine based compounds disclosed in U.S. Pat. No. 4239850, acridine and phenazine compounds disclosed in U.S. Pat. No. 3,751,259, oxaziazole compounds disclosed in U.S. Pat. No. 4,212,970, trihalomethyl-s-triazine based compounds with chromophores disclosed in U.S. Pat. Nos. 3,954,475, 4,189,323, etc., benzophenone group-containing peroxy ester compounds disclosed in Japanese Patent Laid-Open (Kokai) Nos. 59-197401 and 60-76503, etc.

The substrate of the lithographic printing plate used in the present invention is not limited at all, even though it is required to have the flexibility for installation on an ordinary lithographic printing press and to be able to withstand the load applied during printing.

Typical substrates include metallic sheets of aluminum, copper or iron, etc., plastic films such as polyester films and polypropylene film, coated paper, rubber sheet, etc. The substrate can also be composed of a plurality of these materials.

The surface of the substrate can be treated by various treatments such as electrochemical treatment, acid base treatment or corona discharge treatment, etc. for improving plate inspectability and adhesiveness.

For improving adhesiveness and preventing halation, the substrate can also be coated to have a primer layer.

The plate making method using the photosensitive lithographic original plate is described below.

The photosensitive lithographic original plate can be made into a machine plate by a plate making process for negative working. That is, it is exposed to an image through a negative film using an ordinary exposure light source.

The light source used in this exposure step can be, for example, a high pressure mercury lamp, carbon arc lamp, xenon lamp, metal halide lamp, fluorescent lamp, etc. After such ordinary exposure, the plate is rinsed by water or a developer. As a result, the photosensitive compound existing in the non-exposed area in the hydrophilic swellable layer is dissolved and removed or desensitized to form the water swellable non-image area suitable for ink repellency in a phase separated structure, and the exposed area has the photosensitive compound photo-crosslinked and set, to be higher in initial modulus and lower in water swellability than the non-exposed area.

In the photosensitive lithographic original plate as described above, the rubber resiliency and water swellability of the phase separated structure of the hydrophilic swellable layer are changed with the help of the photochemical reaction of the photosensitive compound, to achieve image formation.

The printing method using the lithographic printing plate of the present invention is described below.

The lithographic printing of the present invention uses a known lithographic printing press. That is, an offset printing press, direct printing type, sheet-fed press, web offset printing press, etc. can be used.

After an image is formed on the lithographic printing plate of the present invention, it is installed on the plate cylinder of such a lithographic printing press, and is supplied with ink from the ink form roller in contact with it.

The non-image area in the hydrophilic swellable layer on the plate surface is supplied with dampening water by a dampening system, to repel ink. On the other hand, the image area accepts ink, to supply ink onto the surface of the offset blanket cylinder or the surface of the material to be printed, for forming a printed image.

The dampening water used in the printing with the lithographic printing plate of the present invention can of course be the etchant used in water-using pre-sensitized plates, but can be pure water which does not contain any additive at all.

When the photosensitive lithographic printing plate of the present invention is used for printing, pure water which does not contain any additive at all can be preferably used.

The present invention is described below in more detail in reference to examples.

Examples 1 to 7, and Comparative Examples 1 to 5

A 0.2 mm thick aluminum sheet (produced by Sumitomo Light Metal Industries, Ltd.) was coated with the following composition using any of the hydrophilic polymers shown in Table 1, and heat-treated at 150° C. for 60 minutes, to form a hydrophilic swellable layer of 2 g/m² in thickness.

<Composition of hydrophilic swellable layer>

(1) Hydrophilic polymer shown in Table 1 100 parts by weight
(2) Ethylene glycol diglycidyl ether 20 parts by weight
(3) 2-aminopropyltrimethoxysilane 2 parts by weight
(4) Purified water 900 parts by weight

TABLE 1

| Example | Hydrophilic polymer |
| --- | --- |
| Example 1 | Acrylamide-methyl methacrylate copolymer (30/70 by weight) |
| Example 2 | Styrenesulfonic acid-lauryl methacrylate copolymer (40/60 by weight) |
| Example 3 | Acrylic acid-methyl methacrylate copolymer (50/50 by weight) |
| Example 4 | Polyoxyethylene #10000 blocked with isocyanate at both the terminals |
| Example 5 | Vinylpyrrolidone-methyl methacrylate copolymer (50/50 by weight) |
| Example 6 | Acrylamidemethylpropanesulfonic acid-methyl methacrylate copolymer (30/70 by weight) |
| Example 7 | Sodium acrylate polymer |
| Comparative example 1 | Carboxymethyl cellulose |
| Comparative example 2 | Gelatin |
| Comparative example 3 | Polyviny alcohol of 85% in saponification degree (molar ratio) |
| Comparative example 4 | Hydroxyethyl acrylate-tetraethylene glycol monoacrylate copolymer (80/20 by weight) |
| Comparative example 5 | Isobutylene-maleic anhydride copolymer |

On the hydrophilic swellable layer formed as above, the following photosensitive composition was applied, and the laminate was heat-treated at 100° C. for 3 minutes, to impregnate the hydrophilic swellable layer with 0.5 g/m² of the photosensitive composition.

However, in Example 7, heat treatment at 150° C. for 120 minutes was effected to form a hydrophilic swellable layer of 2 g/m² in thickness, and the laminate was heat-treated at 100° C. for 3 minutes, to impregnate the hydrophilic swellable layer with 0.7 g/m² of the photosensitive composition.

Subsequently, a 12-micron thick biaxially oriented polypropylene film matted on one side was laminated on the hydrophilic swellable layer by a calender roller, with the non-matted side kept in contact with the hydrophilic swellable layer, to obtain a negative lithographic original plate.

The lithographic printing plate was exposed for 90 seconds (3.6 mW/cm²) in contact with a negative film with PCW (plate control wedge produced by Kalle) stuck, using a high pressure mercury lamp "Jet Light 330 3 kW produced by Oak Seisakusho K.K.". The plate was rinsed on the entire surface by city water, to wash away the photosensitive composition in the non-exposed area, for making a machine plate.

(1) Reaction product of xylylenediamine/glycidyl methacrylate (¼ by molar ratio) 10 parts by weight
(2) $CH_2=CHCOO-(C_2H_4O))_{14}-COCH=CH_2$ 10 parts by weight
(3) Michler's ketone 2 parts by weight
(4) 2,4-diethylthioxanthone 2 parts by weight
(5) Ethyl alcohol 76 parts by weight The machine plate obtained was installed in a sheet-fed offset press, "Sprint 25 produced by Komori Corporation K.K.", and while marketed purified water was supplied as dampening water, printing was effected on wood-free paper (62.5 kg/639 mm×939 mm). The ink repellency and the ink anchoring capability were evaluated by visually observing the prints. The amounts of water absorbed by the image area and the non-image area, and the water absorption were measured according to the respective definitions. The results of evaluation are shown in Table 2.

TABLE 2

| Example | Ink anchoring capability and amount of absorbed water (g/m²) (Image area) | Ink repellency and amount of absorbed water (g/m²) (Non-image area) | water absorption (%) |
| --- | --- | --- | --- |
| Example 1 | 0.5 | 2.0 | 100 |
| Example 2 | 2.0 | 7.0 | 350 |
| Example 3 | 2.5 | 8.0 | 400 |
| Example 4 | 0.2 | 1.0 | 50 |
| Example 5 | 1.0 | 5.0 | 250 |
| Example 6 | 2.0 | 10.0 | 500 |
| Example 7 | 3.5 | 33.0 | 1650 |
| Comparative example 1 | <0.1 | 0.5 | 25 |
| Comparative example 2 | <0.1 | 0.8 | 40 |
| Comparative example 3 | <0.1 | 0.5 | 25 |
| Comparative example 4 | <0.1 | 0.8 | 40 |
| Comparative example 5 | <0.1 | 0.8 | 40 |

EXAMPLES 8 TO 14, AND COMPARATIVE EXAMPLES 6 TO 9

Lithographic printing plates were produced as described for Example 1, using the hydrophilic polymer of Example 1, except that the thickness of the hydrophilic swellable layer was changed. However, in Examples 12 to 14, when the hydrophilic swellable layer was heat-treated at 150° C. for 60 minutes, the printing plate obtained was poor in ink anchoring capability during printing, but when heat-treated at 150° C. for 120 minutes, the printing plate obtained was good in ink anchoring capability.

The lithographic printing plate obtained was visually inspected to see whether pinholes were formed as defects of coating. For form retainability, "Hize Gauze" impregnated with pure water was used to rub the non-image area in the hydrophilic swellable layer 20 times, to judge the degree of damage to the printing plate.

The results of evaluation are shown in Table 3.

philic swellable layer was changed. The thicknesses of the respective hydrophilic swellable layers and evaluation results are shown in Table 5.

TABLE 3

| Example | Hydrophilic swellable layer (g/m$^2$) | Ink anchoring capability and amount of absorbed water (g/m$^2$) (image area) | Ink repellency and amount of absorbed water (g/m$^2$) (non-image area) | Pinholes as defects of coating | Form retainability |
|---|---|---|---|---|---|
| Comparative example 6 | 0.1 | <0.1 | 0.1 | Formed | |
| Comparative example 7 | 0.2 | <0.1 | 0.3 | Not formed | |
| Comparative example 8 | 0.5 | 0.1 | 0.5 | Not formed | |
| Comparative example 9 | 0.8 | 0.2 | 0.8 | Not formed | |
| Example 8 | 1 | 0.3 | 1.0 | Not formed | |
| Example 9 | 5 | 0.5 | 5.0 | Not formed | |
| Example 10 | 8 | 0.8 | 8.0 | Not formed | |
| Example 11 | 10 | 1.0 | 10.0 | Not formed | |
| Example 12 | 12 | 1.2 | 12.0 | Not formed | |
| Example 13 | 15 | 1.5 | 15.0 | Not formed | |
| Example 14 | 20 | 2.0 | 20.0 | Not formed | |

EXAMPLES 15 TO 17, AND COMPARATIVE EXAMPLES 10 AND 11

Lithographic printing plates were produced as described for Example 1, except that the hydrophilic polymer of Example 6 was used, and that the thickness of the hydrophilic swellable layer was changed. Evaluation results are shown in Table 4.

TABLE 4

| Example | Hydrophilic swellable layer (g/m$^2$) | Ink anchoring capability and amount of absorbed water (g/m$^2$) (image area) | Ink repellency and amount of absorbed water (g/m$^2$) (non-image area) | Pinholes as defects of coating | Form retainability |
|---|---|---|---|---|---|
| Comparative example 10 | 0.1 | <0.1 | 0.1 | Formed | |
| Example 15 | 0.2 | <0.1 | 1.0 | Not formed | |
| Example 16 | 5.0 | 1.5 | 25.0 | Not formed | |
| Example 17 | 10.0 | 3.0 | 50.0 | Not formed | |
| Comparative example 11 | 12.0 | 3.6 | 60.0 | Not formed | |

EXAMPLES 18 TO 22

Lithographic printing plates were produced as described for Comparative Examples 1 to 5, using the respective hydrophilic polymers, except that the thickness of the hydro

TABLE 5

| Example | Hydrophilic swellable layer (g/m$^2$) | Ink anchoring capability and amount of absorbed water (g/m$^2$) (image area) | Ink repellency and amount of absorbed water (g/m$^2$) (non-imaging area) |
|---|---|---|---|
| Example 18 | 4.0 The same layer composition as used in Comparative example 1 | <0.1 | 1.0 |
| Example 19 | 3.0 The same layer composition as used in Comparative example 2 | <0.1 | 1.2 |
| Example 20 | 2.0 The same layer | <0.1 | 1.0 |

|  | composition as used in Comparative example 3 | | |
|---|---|---|---|
| Example 21 | 3.0 | <0.1 | 1.2 |
|  | The same layer composition as used in Comparative example 4 | | |
| Example 22 | 3.0 | <0.1 | 1.2 |
|  | The same layer composition as used in Comparative example 5 | | |

From the above examples, it can be seen that lithographic printing plates respectively provided with a hydrophilic swellable layer of the present invention is good in ink anchoring capability and ink repellency, free from defects of coating, and satisfactory in form retainability when the water absorbability of the non-image area is in a range from 1 to 50 g/m².

Furthermore, from Tables 3 and 4, it can be seen that especially when the thickness of the hydrophilic layer thickness is in a range from 0.2 to 10 g/m², with the water absorbability kept in a predetermined range, the ink anchoring capability, ink repellency, appearance of coating, and form retainability are good.

From Table 5, it can be seen that if the hydrophilic swellable thickness is 10 to 2000% in the water absorption and is in a predetermined thickness range, it can have a predetermined water absorbability, and therefore that the lithographic printing plate is good in ink anchoring capability and ink repellency.

EXAMPLE 23

The lithographic printing plate used in Example 1 and a machine plate obtained by exposing and developing an ordinary pre-sensitized plate (FNS produced by Fuji Photo Film Co., Ltd.) were installed on the same plate cylinder, and marketed purified water was supplied as dampening water, for printing as described for Example 1.

When the amount of dampening water supplied was more than the standard range of amount in the pre-sensitized plate, the image area extremely declined in ink concentration, and the ink anchoring capability was low due to so-called "dot loss". On the other hand, the image area in the lithographic printing plate of Example 1 was slightly lowered in ink anchoring capability.

When the amount of dampening water supplied was less than the standard range of amount in the pre-sensitized plate, the image area showed ink contamination over the entire surface. On the other hand, the image area in the lithographic printing plate of Example 1 showed a good printed image. The amounts of dampening water supplied were relatively compared in reference to the dial readings of the printing press. Evaluation results are shown in Table 6.

TABLE 6

| Amount of dampening water (dial reading) | State of print | |
|---|---|---|
|  | Printing plate of Example 1 | Pre-sensitized plate |
| Standard range of amount (4–6) |  |  |
| More than the standard range (7.5) |  | (Dot loss) |
| Less than the standard range (3) |  | (Fully scumming) |

As described above, the lithographic printing plate of the present invention is wide in the selectable range of the amount of dampening water supplied, and can provide a good printed image using pure water as dampening water.

EXAMPLES 24 TO 30, AND COMPARATIVE EXAMPLES 12 TO 16

A 0.2 mm thick aluminum sheet (produced by Sumitomo Light Metal Industries, Ltd.) was coated with the following composition using any of the hydrophilic polymers shown in Table 7, and heat-treated at 150° C. for 60 minutes, to form a hydrophilic swellable layer of 2 g/m² in thickness.

<Composition of Hydrophilic Swellable Layer (Parts by Weight)>

(1) Hydrophilic polymer shown in Table 7 100 parts by weight (2) Tetraethylene glycol diglycidyl ether 20 parts by weight (3) 2-aminopropyltrimethoxysilane 2 parts by weight (4) Purified water 900 parts by weight

TABLE 7

| Example | Hydrophilic polymer |
|---|---|
| Example 24 | Acrylamide-n-butyl methacrylate copolymer (20/80 by weight) |
| Example 25 | Styrenesulfonic acid-ethylhexyl methacrylate copolymer (30/70 by weight) |
| Example 26 | Acrylic acid-hydroxyethyl methacrylate copolymer (30/70 by weight) |
| Example 27 | Polyoxyethylene #20000 blocked with isocyanate at both the terminals |
| Example 28 | Vinylpyrrolidone-n-butyl methacrylate copolymer (50/50 by weight) |
| Example 29 | Acrylamidemethylpropanesulfonic acid-n-butyl methacrylate copolymer (30/70 by weight) |
| Example 30 | Sodium acrylate-n-butyl methacrylate copolymer (20/80 by weight) |
| Comparative example 12 | Carboxymethyl cellulose |
| Comparative example 13 | Gelatin |
| Comparative example 14 | Polyvinyl alcohol of 85% in saponification degree (molar ratio) |
| Comparative example 15 | Hydroxyethyl acrylate-tetraethylene glycol monoacrylate copolymer (80/20 by weight) |
| Comparative example 16 | Isobutylene-maleic anhydride copolymer |

On the hydrophilic swellable layer formed as above, the following photosensitive composition was applied, and the laminate was heat-treated at 100° C. for 3 minutes, to impregnate the hydrophilic swellable layer with 0.5 g/m² of the photosensitive composition.

However, in Example 30, heat treatment at 150° C. for 120 minutes was effected to form a hydrophilic swellable layer of 2 g/m² in thickness, and the laminate was heat-treated at 100° C. for 3 minutes, to impregnate the hydrophilic swellable layer with 0.7 g/m² of the photosensitive composition.

Subsequently, a 12-micron thick biaxially oriented polypropylene film matted on one side was laminated on the hydrophilic swellable layer by a calender roller, with the non-matted side kept in contact with the hydrophilic swellable layer, to obtain a negative lithographic original plate.

The lithographic printing plate was exposed for 90 seconds (3.6 mW/cm$^2$) in contact with a negative film with PCW (plate control wedge produced by Kalle) stuck, using a high pressure mercury lamp "Jet Light 330 3 kW produced by Oak Seisakusho K.K.". The plate was rinsed on the entire surface by city water, to wash away the photosensitive composition in the non-exposed area, for making a machine plate.

(1) Reaction product of xylylenediamine/glycidyl methacrylate/methyl glycidyl ether (1/2/2 by molar ratio) 10 parts by weight (2) $CH_2=CHCOO-(C_2H_4O)_{14}-COCH=CH_2$ 10 parts by weight (3) Michler's ketone 2 parts by weight (4) 2,4-diethylthioxanthone 2 parts by weight (5) Ethyl alcohol 76 parts by weight The machine plate obtained was installed in a sheet-fed offset press, "Sprint 25 produced by Komori Corporation K.K.", while marketed purified water was supplied as dampening water, and printing was effected on wood-free paper (62.5 kg/639 mm×939 mm). The ink repellency and the ink anchoring capability were evaluated by visually observing the prints. The initial moduli on the image area and the non-image area, and the water absorption were measured according to the respective definitions. Evaluation results are shown in Table 8.

TABLE 8

| Example | Ink anchoring capability and initial modulus (kgf/mm$^2$) (image area) | Ink repellency and initial modulus (kgf/mm$^2$) (non-image area) | water absorption (%) |
|---|---|---|---|
| Example 24 | 0.35 | 0.07 | 400 |
| Example 25 | 0.66 | 0.20 | 350 |
| Example 26 | 0.80 | 0.25 | 350 |
| Example 27 | 1.20 | 0.40 | 90 |
| Example 28 | 0.45 | 0.10 | 250 |
| Example 29 | 0.30 | 0.05 | 450 |
| Example 30 | 0.22 | 0.03 | 1650 |
| Comparative example 12 | 25.1 | 12.5 | 25 |
| Comparative example 13 | 26.5 | 13.8 | 40 |
| Comparative example 14 | 20.2 | 12.5 | 25 |
| Comparative example 15 | 30.1 | 13.0 | 40 |
| Comparative example 16 | 35.0 | 15.8 | 40 |

EXAMPLES 31 TO 34

Lithographic printing plates of the same composition were produced using the hydrophilic polymer of Example 24, except that they were different in the thickness of the hydrophilic swellable layer. The thicknesses of the hydrophilic swellable layers and evaluation results are shown in Table 9.

TABLE 9

| Example | Hydrophilic swellable layer (g/m$^2$) | Ink anchoring capability and initial modulus (kgf/mm$^2$) (image area) | Ink repellency and initial modulus (kgf/mm$^2$) (non-imaging area) |
|---|---|---|---|
| Example 31 | 1.2 | 0.35 | 0.07 |
| Example 32 | 5.0 | 0.35 | 0.07 |
| Example 33 | 8.0 | 0.35 | 0.07 |
| Example 34 | 10.0 | 0.35 | 0.07 |

EXAMPLE 35

The lithographic printing plate used in Example 24 and a machine plate obtained by exposing and developing an ordinary pre-sensitized plate (FNS produced by Fuji Photo Film Co., Ltd.) were installed on the same plate cylinder, and marketed purified water was supplied as dampening water, for printing as described for Example 24.

When the amount of dampening water supplied was more than the standard range of amount in the pre-sensitized plate, the image area extremely declined in ink concentration, and the ink anchoring capability was low due to so-called "dot loss". On the other hand, the image area in the lithographic printing plate of Example 24 was slightly lowered in ink anchoring capability.

When the amount of dampening water supplied was less than the standard range of amount in the pre-sensitized plate, the image area showed ink contamination over the entire surface. On the other hand, the image area in the lithographic printing plate of Example 24 showed a good printed image. The amounts of dampening water supplied were relatively compared in reference to the dial readings of the printing press. Evaluation results are shown in Table 10.

TABLE 10

| | State of print | |
|---|---|---|
| Amount of dampening water (dial reading) | Printing plate of Example 24 | Pre-sensitized plate |
| Standard range of amount (4–6) | | |
| More than the standard range (7.5) | | (Dot loss) |
| Less than the standard range (3) | | (Fully scumming) |

EXAMPLES 36 TO 42

A 0.2 mm thick aluminum sheet (produced by Sumitomo Light Metal Industries, Ltd.) was coated with the following composition using any of the hydrophilic polymers shown in Table 11, and heat-treated at 150° C. for 60 minutes, to form a hydrophilic swellable layer of 2 g/m$^2$ in thickness.

<Composition of Hydrophilic Swellable Layer (Parts by Weight)>

(1) Hydrophilic polymer shown in Table 11 28 parts by weight (2) Tetraethylene glycol diglycidyl ether 6 parts by weight (3) Water latex "JSR0596" 65 parts by weight
"Carboxy modified styrene-butadiene copolymer latex produced by Dainippon Ink & Chemicals, Inc."

(4) 2-aminopropyltrimethoxysilane 2 parts by weight (5) Purified water 900 parts by weight

TABLE 11

| Example | Hydrophilic polymer |
|---|---|
| Example 36 | Acrylamide-n-butyl methacrylate copolymer (40/60 by weight) |
| Example 37 | Styrenesulfonic acid-ethylhexyl methacrylate copolymer (45/55 by weight) |
| Example 38 | Acrylic acid-hydroxyethyl methacrylate copolymer (35/65 by weight) |
| Example 39 | Polyoxyethylene #50000 blocked with isocyanate at both the terminals |
| Example 40 | Vinylpyrrolidone-n-butyl methacrylate copolymer (60/40 by weight) |
| Example 41 | Acrylamidemethylpropanesulfonic acid-n-butyl methacrylate copolymer (20/80 by weight) |
| Example 42 | Sodium acrylate-n-butyl methacrylate copolymer (40/60 by weight) |

On the hydrophilic swellable layer formed as above, the following photosensitive composition was applied, and the laminate was heat-treated at 100° C. for 3 minutes, to impregnate the hydrophilic swellable layer with 0.5 g/m² of the photosensitive composition.

Subsequently, a 12-micron thick biaxially oriented polypropylene film matted on one side was laminated on the hydrophilic swellable layer by a calender roller, with the non-matted side kept in contact with the hydrophilic swellable layer, to obtain a negative lithographic original plate.

The lithographic printing plate obtained was exposed for 90 seconds (3.6 mW/cm²) in contact with a negative film with PCW (plate control wedge produced by Kalle) stuck, using a high pressure mercury lamp "Jet Light 3303 kW produced by Oak Seisakusho K.K.". The plate was rinsed on the entire surface by city water, to wash away the photosensitive composition in the non-exposed area, for making a machine plate.

The hydrophilic swellable layers of the machine plates obtained in Examples 36 to 42 were swollen by water in the ink repellent portions, and dyed with $OsO_4$, being observed with a transmission electron microscope (TEM).

As a result of observation, a phase separated structure consisting of a phase mainly composed of a hydrophilic polymer and a phase mainly composed of a hydrophobic polymer as shown in FIG. 2 could be confirmed.

(1) Reaction product of xylylenediamine/glycidyl methacrylate/methyl glycidyl ether (1/2/2 by molar ratio) 10 parts by weight (2) $CH_2$=CHCOO—$(C_2H_4O)_{14}$—COCH=$CH_2$ 10 parts by weight (3) Michler's ketone 2 parts by weight (4) 2,4-diethylthioxanthone 2 parts by weight (5) Ethyl alcohol 76 parts by weight The machine plate obtained was installed in a sheet-fed offset press, "Sprint 25 produced by Komori Corporation K.K.", while marketed purified water was supplied as dampening water, and printing was effected on wood-free paper (62.5 kg/639 mm×939 mm). The ink repellency and the ink anchoring capability were evaluated by visually observing the prints. The initial moduli on the image area and the non-image area, and the water absorption were measured according to the respective definitions. Evaluation results are shown in Table 12.

TABLE 12

| Example | Ink anchoring capability and initial modulus (kgf/mm²) (image area) | Ink repellency and initial modulus (kgf/mm²) (non-imaging area) | Water absorption (%) |
|---|---|---|---|
| Example 36 | 0.34 | 0.08 | 340 |
| Example 37 | 0.69 | 0.18 | 190 |
| Example 36 | 0.83 | 0.21 | 260 |
| Example 39 | 1.22 | 0.40 | 70 |
| Example 40 | 0.47 | 0.10 | 160 |
| Example 41 | 0.33 | 0.09 | 370 |
| Example 42 | 0.22 | 0.05 | 390 |

After printing about 1000 sheets, the respective machine plates were not contaminated by ink, and the prints were sufficient in contrast and clear.

Comparative Example 17

A 0.2 mm thick aluminum plate (Sumitomo Chemical Industries, Ltd.) was coated with the following composition, and heat-treated at 150° C. for 120 minutes, to form a hydrophilic swellable layer of 2 g/m² in thickness.

<Composition of Hydrophilic Swellable Layer (Parts by Weight)>

(1) Hydrophilic polymer used in Example 38 93 parts by weight (2) Tetraethylene glycol diglycidyl ether 5 parts by weight (3) 2-aminopropyltrimethoxysilane 2 parts by weight (4) Purified water 900 parts by weight The hydrophilic swellable layer obtained was coated with a photosensitive composition as described for Example 36, to form a photosensitive lithographic printing plate, and it was processed as described for Example 36, to obtain a machine plate. The water absorption of the hydrophilic swellable layer was 2500%. The hydrophilic swellable layer of the machine plate obtained was swollen by water in the ink repellent portion, and dyed with $OsO_4$, being observed using a transmission electron microscope (TEM).

As a result of observation, a homogenous phase structure mainly composed of the hydrophilic polymer was observed.

After printing about 50 sheets, the hydrophilic swellable layer came off from the substrate, and ink contamination occurred.

EXAMPLES 43 TO 46

Photosensitive lithographic printing plates were produced as described for Example 38, except that any of the latexes shown in Table 13 was used instead of the water latex of Example 38. The hydrophilic swellable layers of the respective machine plates obtained were swollen by water in the ink repelling portions and dyed with $OsO_4$, being observed using a transmission electron microscope (TEM).

As a result of observation, a phase separated structure consisting of a continuous phase mainly composed of a hydrophobic polymer and a dispersed phase mainly composed of a hydrophilic polymer was observed.

Evaluation results are shown in Table 14.

TABLE 13

| Example | Latex |
|---|---|
| Example 43 | JSR0560 |
| | Styrene-butadiene copolymer latex |
| Example 44 | JSR0592 |
| | Carboxy modified styrene-butadiene copolymer latex |
| Example 45 | JSR0650 |
| | Vinylpyridine-styrene-butadiene copolymer latex |
| Example 46 | JSR0700 |
| | Butadiene polymer latex |

TABLE 14

| Example | Ink anchoring capability and initial modulus (kgf/mm$^2$) (image area) | Ink repellency and initial modulus (kgf/mm$^2$) (non-imaging area) | Ct of water absorption (%) |
|---|---|---|---|
| Example 43 | 0.40 | 0.20 | 140 |
| Example 44 | 0.56 | 0.30 | 190 |
| Example 45 | 0.70 | 0.25 | 150 |
| Example 46 | 0.80 | 0.35 | 100 |

After printing about 5000 sheets, the respective machine plates were not contaminated by ink, and the prints obtained were sufficient in contrast and clear.

EXAMPLES 47 TO 53

A 0.2 mm thick aluminum sheet (produced by Sumitomo Light Metal Industries, Ltd.) was coated with the following composition using any of the hydrophilic polymers shown in Table 11, and heat-treated at 150° C. for 60 minutes, to form a hydrophilic swellable layer of 2 g/m$^2$ in thickness.

<Composition of Hydrophilic Swellable Layer (Parts by Weight)>

(1) Hydrophilic polymer shown in Table 11 28 parts by weight (2) Tetraethylene glycol diglycidyl ether 5 parts by weight (3) Water polymer emulsion "AB-735" [Acrylic emulsion produced by Dainippon Ink & Chemicals, Inc. 65 parts by weight (4) 2-aminopropyltrimethoxysilane 2 parts by weight (5) Purified water 900 parts by weight The hydrophilic swellable layer formed as above was coated with the same photosensitive composition as used in Example 36, and the laminate was heat-treated at 100° C. for 3 minutes, to impregnate the hydrophilic swellable layer with 0.5 g/m$^2$ of the photosensitive composition. Subsequently, a 12-micron thick biaxially oriented polypropylene film matted on one side was laminated on the hydrophilic swellable layer by a calender roller, with the non-matted side kept in contact with the hydrophilic swellable layer, to obtain a negative lithographic original plate. It was processed as described for Example 36, to obtain a machine plate. The hydrophilic swellable layers of the respective machine plates obtained were swollen by water in the ink repellent portion, and dyed with OsO$_4$, being observed using a transmission electron microscope (TEM).

As a result of observation, a phase separated structure consisting of a phase mainly composed of a hydrophilic polymer and a phase mainly composed of a hydrophobic polymer as shown in FIG. 3 could be confirmed.

TABLE 15

| Example | Ink anchoring capability and initial modulus (kgf/mm$^2$) (image area) | Ink repellency and initial modulus (g/m$^2$) (non-imaging area) | water absorption (%) |
|---|---|---|---|
| Example 47 | 0.34 | 0.08 | 440 |
| Example 48 | 0.69 | 0.21 | 290 |
| Example 49 | 0.83 | 0.27 | 360 |
| Example 50 | 1.22 | 0.43 | 100 |
| Example 51 | 0.47 | 0.12 | 260 |
| Example 52 | 0.33 | 0.07 | 470 |
| Example 53 | 0.22 | 0.03 | 490 |

After printing about 5000 sheets, the respective machine plates were not contaminated by ink, and the prints obtained were sufficient in contrast and clear.

EXAMPLES 54 TO 57

Photosensitive lithographic printing plates were produced as described for Example 38, except that the any of the aqueous emulsions shown in Table 16 was used instead of the latex of Example 38. The hydrophilic swellable layers of the respective machine plates obtained were swollen by water in the ink repelling portions and dyed with OsO$_4$, being observed using a transmission electron microscope (TEM).

As a result of observation, a phase separated structure consisting of a continuous phase mainly composed of a hydropobic polymer and a dispersed phase mainly composed of a hydrophilic polymer was observed.

The evaluation results are shown in Table 17.

TABLE 16

| Example | Aqueous emulsion |
|---|---|
| Example 54 | Sodium acrylate-n-butyl methacrylate copolymer (5/95 by weight) |
| Example 55 | Sodium acrylate-ethylhexyl methacrylate-triethylene glycol diacrylate copolymer (5/95 by weight) |
| Example 56 | Sodium acrylate-trimethylolpropane triacrylate copolymer (5/95 by weight) |
| Example 57 | Hydroxyethyl methacrylate-triethylene glycol diacrylate copolymer (30/70 by weight) |

TABLE 17

| Example | Ink anchoring capability and initial modulus (kgf/mm$^2$) (image area) | Ink repellency and initial modulus (g/m$^2$) (non-imaging area) | Water absorption (%) |
|---|---|---|---|
| Example 54 | 0.35 | 0.30 | 150 |
| Example 55 | 0.66 | 0.28 | 200 |
| Example 56 | 0.80 | 0.27 | 110 |
| Example 57 | 0.90 | 0.35 | 90 |

After printing about 5000 sheets, the respective machine plates were not contaminated by ink, and the prints obtained were sufficient in contrast and clear.

EXAMPLE 58

The lithographic printing plate used in Example 36 and a machine plate obtained by exposing and developing an ordinary pre-sensitized plate (FNS produced by Fuji Photo Film Co., Ltd.) were installed on the same plate cylinder, and marketed purified water was supplied as dampening water, for printing as described for Example 36.

When the amount of dampening water supplied was more than the standard range of amount in the pre-sensitized plate, the image area extremely declined in ink concentration, and the ink anchoring capability was low due to so-called "dot loss". On the other hand, the image area in the lithographic printing plate of Example 36 was slightly lowered in ink anchoring capability.

When the amount of dampening water supplied was less than the standard range of amount in the pre-sensitized plate, the image area showed ink contamination over the entire surface. On the other hand, the image area in the lithographic printing plate of Example 36 showed a good printed image. The amounts of dampening water supplied were relatively compared in reference to the dial readings of the printing press. Evaluation results are shown in Table 18.

TABLE 18

| | State of print | |
|---|---|---|
| Amount of dampening water (dial reading) | Printing plate of Example 36 | Pre-sensitized plate |
| Standard range of amount (4–6) | | |
| More than the standard range (7.5) | | (Dot loss) |
| Less than the standard range (3) | | (Fully scumming) |

EXAMPLES 59 TO 65

A 0.2 mm thick aluminum sheet (produced by Sumitomo Light Metal Industries, Ltd.) was coated with the following composition using any of the hydrophilic polymers shown in Table 19, and heat-treated at 150° C. for 60 minutes, to form a hydrophilic swellable layer of 2 g/m2 in thickness.

<Composition of Hydrophilic Swellable Layer>

(1) Hydrophilic polymer shown in Table 19 100 parts by weight (2) Ethylene glycol diglycidyl ether 20 parts by weight (3) 2-aminopropyltrimethoxysilane 2 parts by weight (4) Purified water 900 parts by weight

TABLE 19

| Example | Hydrophilic polymer |
|---|---|
| Example 59 | Acrylamide-hydroxyphenyl methacrylate copolymer (30/70 by weight) |
| Example 60 | Styrenesulfonic acid-ethoxyethyl methacrylate copolymer (40/60 by weight) |
| Example 61 | Acrylic acid-ethylhexyl methacrylate copolymer (50/50 by weight) |
| Example 62 | Polyoxyethylene #30000 block isocyanated at both the terminals |
| Example 63 | Vinylpyrrolidone-ethylhexyl methacrylate copolymer (50/50 by weight) |
| Example 64 | Acrylamidemethylpropanesulfonic acid-ethoxyethyl methacrylate copolymer (30/70 by weight) |
| Example 65 | Sodium acrylate polymer |

On the hydrophilic swellable layer formed as above, the following photosensitive composition was applied, and the laminate was heat-treated at 100° C. for 3 minutes, to impregnate the hydrophilic swellable layer with 0.5 g/m² of the photosensitive composition.

However, in Example 65, heat treatment at 150° C. for 120 minutes was effected to form a hydrophilic swellable layer of 2 g/m² in thickness, and the laminate was heat-treated at 100° C. for 3 minutes, to impregnate the hydrophilic swellable layer with 0.7 g/m² of the photosensitive composition.

Subsequently, a 12-micron thick biaxially oriented polypropylene film matted on one side was laminated on the hydrophilic swellable layer by a calender roller, with the non-matted side kept in contact with the hydrophilic swellable layer, to obtain a negative lithographic original plate.

The lithographic printing plate was exposed for 90 seconds (3.6 mW/cm²) in contact with a negative film with PCW (plate control wedge produced by Kalle) stuck, using a high pressure mercury lamp "Jet Light 3303 kW produced by Oak Seisakusho K.K.". The plate was rinsed on the entire surface by city water, to wash away the photosensitive composition in the non-exposed area, for making a machine plate.

(1) Reaction product of xylylenediamine/glycidyl methacrylate (¼ by molar ratio) 10 parts by weight (2) $CH_2=CHCOO-(C_2H_4O)_{14}-COCH=CH_2$ 10 parts by weight (3) Michler's ketone 2 parts by weight (4) 2,4-diethylthioxanthone 2 parts by weight (5) Ethyl alcohol 76 parts by weight The machine plate obtained was installed in a sheet-fed offset press, "Sprint 25 produced by Komori Corporation K.K.", while marketed purified water was supplied as dampening water, and printing was effected on wood-free paper (62.5 kg/639 mm×939 mm). The ink repellency and the ink anchoring capability were evaluated by visually observing the prints. The water swelling ratios on the image area and the non-image area, and the water absorption were measured according to the respective definitions. Evaluation results are shown in Table 20.

TABLE 20

| Example | Ink anchoring capability (Image area) | Ink repellency (Non-image area) | Water swelling ratio of non-image area (%) | |
|---|---|---|---|---|
| | | | (A) | (B) |
| Example 59 | | | 135 | 141 |
| Example 60 | | | 333 | 333 |
| Example 61 | | | 420 | 432 |
| Example 62 | | | 55 | 59 |
| Example 63 | | | 262 | 255 |
| Example 64 | | | 573 | 560 |
| Example 65 | | | 1700 | 1685 |
| Comparative example 18 | | | 8 | 9 |

Figure 4:
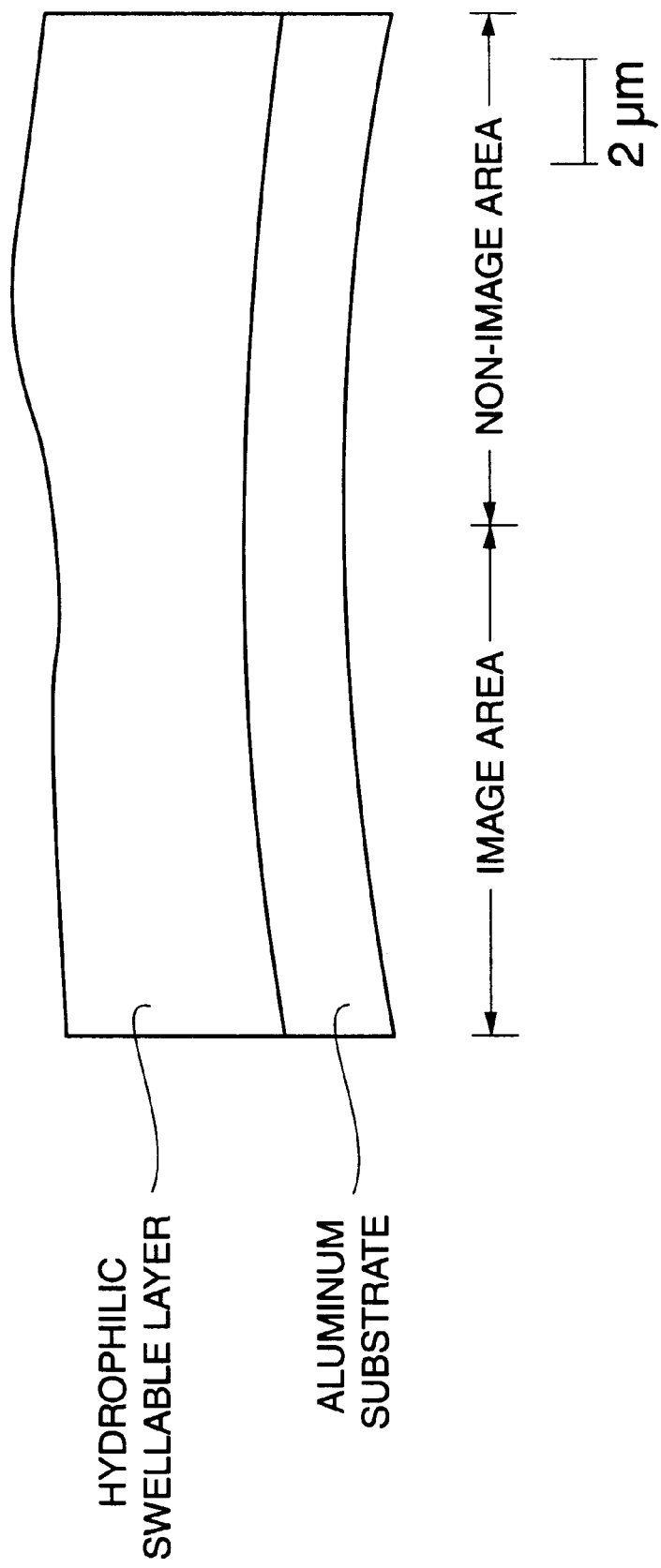
FIG. 4 is a typical view showing a transmission electron microscope image where the image area and the non-image area of the lithographic printing plate of Example 59 are swollen by the measuring method (B).

A typical view showing a transmission electron microscope image where the image area and the non-image area of the lithographic printing plate of Example 59 are swollen by the method for measuring the water swelling ratio (B) is shown in FIG. 4. The non-image area swollen to be thick in layer thickness and the image area thinner than the non-image area in layer thickness due to a smaller water swelling ratio can be observed in comparison.

The lithographic printing plate of Example 59 was 15% in the water swelling ratio of the image area and 145% in the non-image area.

Comparative Example 18

A lithographic printing plate was produced as described for Example 59, except that chloroprene latex was used instead of the hydrophilic polymer of Example 59. Evaluation results are shown in Table 20.

EXAMPLE 66

The lithographic printing plate used in Example 59 and a machine plate obtained by exposing and developing an ordinary pre-sensitized plate (FNS produced by Fuji Photo Film Co., Ltd.) were installed on the same plate cylinder, and marketed purified water was supplied as dampening water, for printing as described for Example 59.

When the amount of dampening water supplied was more than the standard range of amount in the pre-sensitized plate, the image area extremely declined in ink concentration, and the ink anchoring capability was low due to so-called "dot loss". On the other hand, the image area in the lithographic printing plate of Example 59 was slightly lowered in ink anchoring capability.

When the amount of dampening water supplied was less than the standard range of amount in the pre-sensitized plate, the image area showed ink contamination over the entire surface. On the other hand, the image area in the lithographic printing plate of Example 59 showed a good printed image. The amounts of dampening water supplied were relatively compared in reference to the dial readings of the printing press. Evaluation results are shown in Table 21.

TABLE 21

| Amount of dampening water (dial reading) | State of print | |
|---|---|---|
| | Printing plate of Example 59 | Pre-sensitized plate |
| Standard range of amount (4–6) | | |
| More than the standard range (7.5) | | (Dot loss) |
| Less than the standard range (3) | | (Fully scumming) |

Industrial Applicability

The lithographic printing plate of the present invention uses a hydrophilic swellable layer with a water absorbability, initial modulus, water swelling ratio, and phase separated structure, for the non-image area. So, ink can be repelled efficiently by supplying only a small amount of dampening water, and the dampening water can be controlled in a wider range. Furthermore, printing can be effected without using any usually used solvent such as isopropanol.

When an image is formed from the photosensitive lithographic original plate of the present invention with the help of a photosensitive compound, the physical development required in the conventional pre-sensitized plate is not required at all, to allow very simple plate making. Moreover, since no special surface treatment is required for manifesting the ink repellency, an inexpensive photosensitive lithographic original plate can be produced.

We claim:

1. A lithographic printing plate, comprising an image area and non-image area, wherein the non-image area comprises a hydrophilic swellable layer and has the following characteristics:

(1) a water absorbability of 1 to 50 g/m$^2$, (2) an initial modulus of 0.01 to 10 kgf/mm$^2$, (3) a water absorption of 50 to 2000% or a water swelling ratio of 50 to 2000% and (4) a water absorbability or water swelling ratio greater than that of the image area.

2. A lithographic printing plate according to claim 1, wherein the non-image area has an initial modulus less than that of the image area.

3. A lithographic printing plate according to claim 1, wherein the non-image area has a water absorbability greater than that of the image area.

4. A lithographic printing plate according to claim 1, wherein the hydrophilic swellable layer has a phase separated structure comprising a phase composed of a hydrophilic polymer and another phase composed of a hydrophobic polymer.

5. A lithographic printing plate according to claim 4, wherein the hydrophobic polymer is obtained from an aqueous emulsion.

6. A lithographic printing plate according to claim 4, wherein the hydrophobic polymer is obtained from a latex comprising a conjugated diene based compound.

7. A lithographic printing plate according to claim 4, wherein 60 to 95 wt % of the hydrophilic swellable layer is formed of the hydrophobic polymer.

8. A lithographic printing plate according to claim 4, wherein the non-image area has a water absorbability less than that of the image area.

9. A lithographic printing plate according to claim 4, wherein the non-image area has an initial modulus less than that of the image area.

10. A lithographic printing plate according to claim 4, wherein the non-image area has a water swelling ratio of 50 to 2000%, and the non-image area has a water swelling ratio greater than that of the image area.

11. A process for producing the lithographic printing plate of claim 1, comprising the steps of providing a photosensitive lithographic original plate comprising a hydrophilic swellable layer on a substrate and irradiating a surface of said original plate with an active beam to provide an image area and a non-image area on said surface, said image area having a different water absorbability or different initial modulus from said non-image area.

12. A process of producing the lithographic printing plate according to claim 11, wherein the image area and the non-image area have different water swelling ratios.

13. A process of producing the lithographic printing plate according to claim 11, wherein the hydrophilic swellable layer has a phase separated structure consisting of at least a first phase comprising a hydrophilic polymer and a second phase comprising a hydrophobic polymer.

14. A lithographic printing plate, comprising an image area and a non-image area, wherein the non-image area comprises a hydrophilic swellable layer has and has the following characteristics:

(1) a water absorbability of 1 to 50 g/m$^2$, (2) an initial modulus of 0.01 to 10 kgf/mm$^2$, and (3) a water swelling ratio of 50 to 2000%, and wherein the non-image area has a water swelling ratio greater than that of the image area.

15. A lithographic printing plate according to claim 1, 2, 14 or 4, wherein the hydrophilic swellable layer is applied to a thickness of 0.2 to 10 g/m$^2$.

16. A lithographic original plate comprising a hydrophilic swellable layer which is formed on a substrate, wherein the hydrophilic swellable layer has the following characteristics:

(1) a water absorbability of 1 to 50 g/m$^2$, (2) an initial modulus of 0.01 to 10 kgf/mm$^2$, and (3) a water absorption of 50 to 2000% or a water swelling ratio of 50 to 2000%.

17. A lithographic original plate according to claim 16, wherein the hydrophilic swellable layer has a water swelling ratio of 50 to 2000%.

18. A lithographic original plate according to claim 16, wherein the hydrophilic swellable layer has a phase separated structure consisting of at least a first phase comprising a hydrophilic polymer and a second phase comprising a hydrophobic polymer.

19. A lithographic original plate according to claim 18, wherein the hydrophobic polymer is mainly in the form of an aqueous emulsion.

20. A lithographic original plate according to claim 18, wherein the hydrophobic polymer is mainly composed of a latex comprising a conjugated diene compound.

21. A lithographic original plate according to claim 18, wherein 60 to 95 wt % of the hydrophilic swellable layer is formed of the hydrophobic polymer.

22. A lithographic original plate according to claim 18, wherein the hydrophilic swellable layer has a water swelling ratio of 50 to 2000%.

23. A lithographic original plate according to claim 16, 17 or 18, wherein the hydrophilic swellable layer is applied to a thickness of 0.2 to 10 $g/m^2$.

24. A lithographic original plate according to claim 16, wherein the hydrophilic swellable layer has a water absorption of 50 to 2000%.

25. A lithographic printing plate, comprising an image area and non-image area, wherein the non-image area comprises a hydrophilic swellable layer and has the following characteristics:

(1) a water absorbability of 1 to 50 $g/m^2$, (2) an initial modulus of 0.01 to 10 $kgf/mm^2$, (3) a water absorption of 50 to 2000% and a water swelling ratio of 10 to 2000%; and (4) a water absorbability or water swelling ratio greater than that of the image area.

* * * * *